United States Patent [19]
Sawai et al.

[11] Patent Number: 6,060,781
[45] Date of Patent: May 9, 2000

[54] SEMICONDUCTOR DEVICE

[75] Inventors: Kouetsu Sawai; Toshikazu Tsutsui, both of Tokyo, Japan

[73] Assignee: Mitsubishi Denki Kabushiki Kaisha, Tokyo, Japan

[21] Appl. No.: 09/347,003

[22] Filed: Jul. 2, 1999

[30] Foreign Application Priority Data

Feb. 4, 1999 [JP] Japan ................................. 11-027066

[51] Int. Cl.⁷ .............................................. H01L 21/4763
[52] U.S. Cl. .......................... 257/734; 257/522; 257/758; 257/773
[58] Field of Search ............................ 438/618; 257/734, 257/758, 773, 522

[56] References Cited

U.S. PATENT DOCUMENTS 5,036,380  7/1991  Chase .
5,817,530  10/1998 Ball .
5,889,333  3/1999  Takenaka et al. .

FOREIGN PATENT DOCUMENTS 62-271444  11/1987  Japan .
4-151846   5/1992   Japan .
5-144901   6/1993   Japan .

*Primary Examiner*—Kevin M. Picardat
*Assistant Examiner*—D. Mark Collins
*Attorney, Agent, or Firm*—Oblon, Spivak, McClelland, Maier & Neustadt, P.C.

[57] ABSTRACT

First interconnect lines each having an electric capacity given by C and second interconnect lines respectively adjacent thereto are formed on an upper surface of an insulating film. The first interconnect lines and the second interconnect lines are electrically isolated from a substrate and are electrically floating. The second interconnect lines are connected to a third interconnect line. As a result, the second interconnect lines and the third interconnect line which are electrically connected to each other as a whole have an electric capacity given by 12C. The first interconnect lines are irradiated with charged particles. The difference in the amount of secondary electrons emitted from the first interconnect lines depending on the magnitude of the electric capacity is detected as a potential contrast and used to evaluate whether or not there is contact between the first interconnect lines and the respectively associated second interconnect lines. A semiconductor device facilitates the evaluation of whether or not there is contact between adjacent conductor patterns.

8 Claims, 27 Drawing Sheets

F I G . 2 4
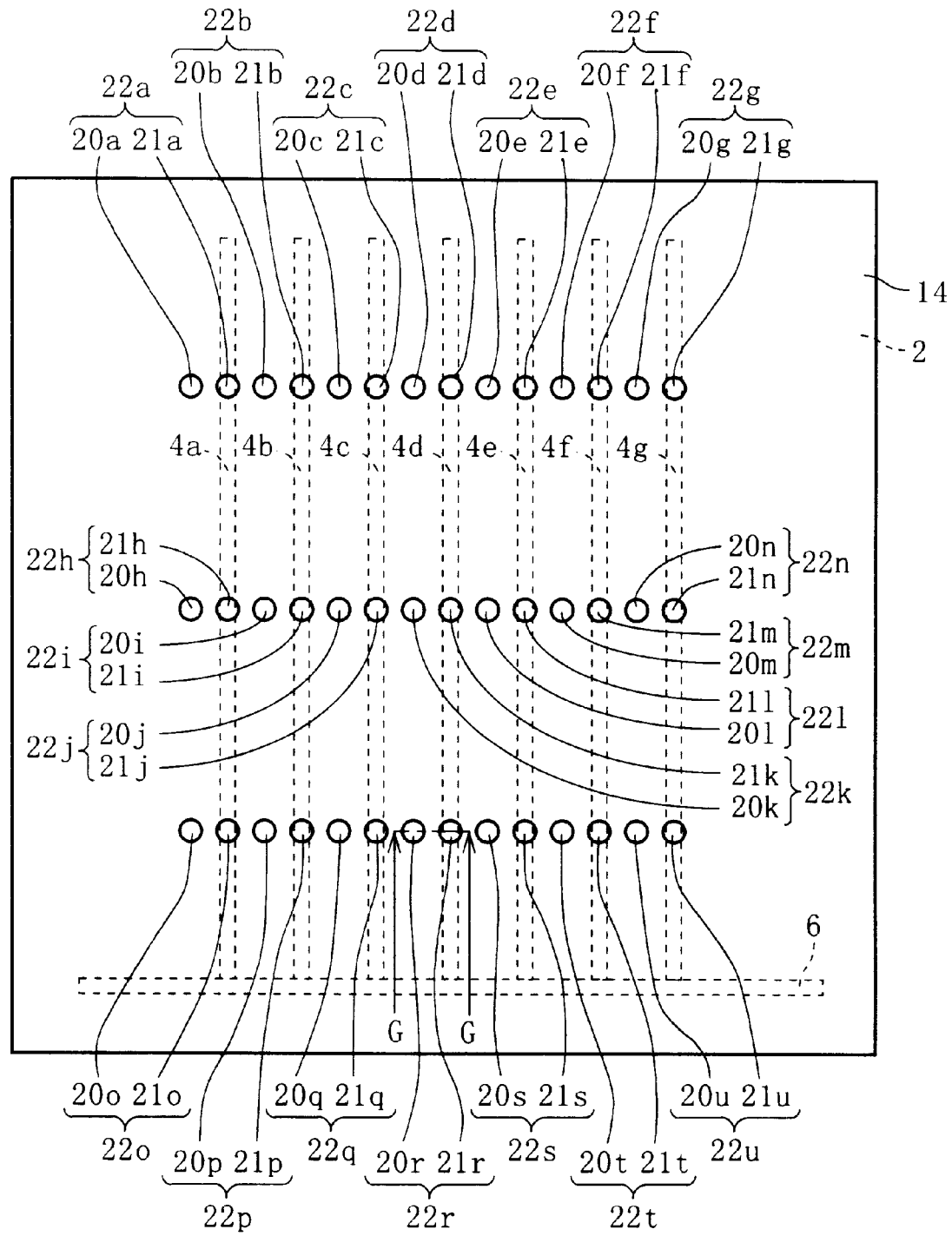

6,060,781

SEMICONDUCTOR DEVICE

BACKGROUND OF THE INVENTION

1. Field of the Invention

The present invention relates to a semiconductor device and, more particularly, to a semiconductor device for use as an object to be evaluated in a method of evaluating whether or not there is contact between adjacent conductor patterns of the semiconductor device.

2. Description of the Background Art

In the manufacturing process of semiconductor devices such as LSI circuits, whether or not there is contact between adjacent interconnect lines has been evaluated without physical contact with the semiconductor devices (as disclosed in Japanese Patent Application Laid-Open No. P62-271444A (1987)).

FIG. 37 is a top plan view of a background art semiconductor device to be evaluated. A plurality of interconnect lines 103a to 103g and a plurality of interconnect lines 104a to 104g are arranged alternately on an upper surface of an insulating film 102. In the arrangement shown in FIG. 37, the interconnect lines 103a to 103g are paired with the interconnect lines 104a to 104g adjacent to the interconnect lines 103a to 103g to constitute a total of seven test patterns 106a to 106g, respectively.

FIG. 38 is a cross-sectional view of the semiconductor device taken along the line A—A of FIG. 37. The insulating film 102 is formed on the entire upper surface of a substrate 101. The interconnect lines 103a and 104a are formed adjacent to each other on the upper surface of the insulating film 102. A contact hole 105a filled with a conductor is formed extending through the insulating film 102 between the upper surface of the insulating film 102 and the upper surface of the substrate 101 under the interconnect line 104a. As a result, the interconnect line 104a is electrically connected through the contact hole 105a to the substrate 101, and the interconnect line 103a is electrically floating. Although there is shown in FIG. 38 only a representative section of the semiconductor device of FIG. 37 in which the interconnect lines 103a and 104a are formed, other sections of the semiconductor device in which the interconnect lines 103b to 103g and the interconnect lines 104b to 104g are formed are similar in construction to the section shown in FIG. 38. Specifically, the interconnect lines 104b to 104g are electrically connected through respective contact holes 105b to 105g filled with a conductor to the substrate 101, and the interconnect lines 103b to 103g are electrically floating.

Referring to FIG. 38, whether or not there is contact between the interconnect lines 103a and 104a may be evaluated by observing the surface of the semiconductor device through an electron microscope such as a SEM (Scanning Electron Microscope). More particularly, charged particles such as an electron beam are directed toward a section of the semiconductor device in which at least the interconnect line 103a is formed, to inject electric charges into the interconnect line 103a. If there is no contact between the interconnect lines 103a and 104a, the electric charges injected in the interconnect line 103a are stored in the interconnect line 103a. Then, the interconnect line 103a is at a predetermined potential depending on the amount of injected electric charges. On the other hand, if there is contact between the interconnect lines 103a and 104a, the electric charges injected in the interconnect line 103a flow through the interconnect line 104a and the contact hole 105a into the substrate 101. That is, the electric charges injected in the interconnect line 103a are not stored in the interconnect line 103a, and the interconnect line 103a is at the same potential as the substrate 101 (e.g., at a ground potential). Thus, the potential at the interconnect line 103a irradiated with the charged particles differs depending on whether or not there is contact between the interconnect lines 103a and 104a. The amount of secondary electrons emitted from the interconnect line 103a differs depending on the level of the potential at the interconnect line 103a.

Therefore, the difference between all of the electrically floating interconnect lines 103a to 103g in the amount of secondary electrons emitted therefrom may be detected as a potential contrast and used to evaluate whether or not there is contact between the interconnect lines 103a to 103g and the interconnect lines 104a to 104g.

In such a background art semiconductor device, the potential at the interconnect line 104a which is one of the single pair of interconnect lines 103a and 104a adjacent to each other is fixed to the potential at the substrate 101, as illustrated in FIG. 38. This requires the formation of the contact hole 105a for establishing an electric connection between the interconnect line 104a and the substrate 101, resulting in an increased number of steps in the manufacturing process of the semiconductor device.

Further, as shown in FIG. 37, the plurality of test patterns 106a to 106g are formed on the upper surface of the insulating film 102 in such a manner that the interconnect lines 103a to 103g and the respectively associated interconnect lines 104a to 104g are in equally spaced apart relationship. Therefore, there has been a need to separately manufacture a plurality of additional semiconductor devices having different interconnect line spacings in order to determine a minimum interconnect line spacing which allows adjacent interconnect lines to be arranged in non-contacting relationship in the photolithographic technique employed for the manufacturing of a semiconductor device.

SUMMARY OF THE INVENTION

A first aspect of the present invention is intended for a semiconductor device. According to the present invention, the semiconductor device comprises: a substrate; a first conductor pattern electrically isolated from the substrate and having a first electric capacity and a first exposed part to be irradiated with charged particles; a second conductor pattern electrically isolated from the substrate and formed adjacent to the first conductor pattern, the second conductor pattern having a second electric capacity and a second exposed part to be irradiated with the charged particles; and a conductor region electrically isolated from the substrate and electrically connected to the second conductor pattern, the conductor region having a third electric capacity, the charged particles being uniformly distributed in the first and second exposed parts, wherein the sum of the second electric capacity and the third electric capacity is greater than the first electric capacity.

Preferably, according to a second aspect of the present invention, the semiconductor device of the first aspect further comprises a plurality of test patterns each having the first conductor pattern and the second conductor pattern taken as a pair, the plurality of test patterns including two test patterns differing from each other in spacing between the pair of first and second conductor patterns.

Preferably, according to a third aspect of the present invention, in the semiconductor device of the first aspect, the sum of the second electric capacity and the third electric capacity is at least twice the first electric capacity.

A fourth aspect of the present invention is intended for a semiconductor device. According to the present invention, the semiconductor device comprises: a substrate; an interconnect line electrically isolated from the substrate; a first contact hole filled with a first conductor and having an exposed part to be irradiated with a charged particle, the first conductor being electrically connected to the interconnect line and electrically isolated from the substrate; and a plurality of second contact holes each filled with a second conductor electrically connected to the substrate, the plurality of second contact holes being arranged adjacent to the interconnect line.

Preferably, according to a fifth aspect of the present invention, the semiconductor device of the fourth aspect further comprises a plurality of third contact holes each filled with a third conductor electrically connected to the interconnect line and electrically isolated from the substrate, the plurality of third contact holes being arranged adjacent to the plurality of second contact holes respectively.

In accordance with the first aspect of the present invention, the electric capacity of the first conductor pattern equals the first electric capacity if the first conductor pattern is out of contact with the second conductor pattern, and the electric capacity of the first conductor pattern equals the sum of the first, second and third electric capacities if the first conductor pattern is in contact with the second conductor pattern. When the semiconductor device is used as an object to be evaluated in an evaluating method by irradiation with a charged particle, the amount of secondary electrons emitted from the first conductor pattern depending on the magnitude of the electric capacity of the first conductor pattern may be detected and used to evaluate whether or not there is contact between the first conductor pattern and the second conductor pattern. Additionally, since the second conductor pattern and the conductor region are separately formed and the conductor region need not be irradiated with the charged particle, a region to be irradiated with the charged particle may be reduced in area.

In accordance with the second aspect of the present invention, the single semiconductor device may be used to evaluate a minimum spacing between the first and second conductor patterns adjacent to each other in non-contacting relationship.

In accordance with the third aspect of the present invention, the difference in the amount of secondary electrons emitted from the first conductor pattern may be increased depending on whether or not the first and second conductor patterns are in contact with each other. This difference may be detected distinctly.

In accordance with the fourth aspect of the present invention, if any one of the plurality of second contact holes is in contact with the interconnect line, the first contact hole and the interconnect line are electrically connected to the substrate through the contacting second contact hole. If all of the plurality of second contact holes are out of contact with the interconnect line, the first contact hole and the interconnect line are not electrically connected to the substrate. The potential at the first contact hole differs depending on whether or not the first contact hole is electrically connected to the substrate. Therefore, when the semiconductor device is used as an object to be evaluated in an evaluating method by irradiation with a charged particle, the amount of secondary electrons emitted from the first contact hole may be detected and used to readily evaluate whether any one of the plurality of second contact holes is in contact with the interconnect line or all of the plurality of second contact holes are out of contact with the interconnect line.

In accordance with the fifth aspect of the present invention, the amount of secondary electrons emitted from the first contact hole may be detected and used to readily evaluate whether any one of the plurality of second contact holes is in contact with its associated third contact hole adjacent thereto or all of the plurality of second contact holes are out of contact with the respectively associated third contact holes.

It is therefore an object of the present invention to provide a semiconductor device which can facilitate an evaluation of whether or not there is contact between adjacent conductor patterns without the increase in the number of semiconductor manufacturing process steps.

It is another object of the present invention to provide a semiconductor device which can be used by itself to determine a minimum spacing between adjacent conductor patterns in non-contacting relationship.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a top plan view of the semiconductor device according to a sixth preferred embodiment of the present invention;

DESCRIPTION OF THE PREFERRED EMBODIMENTS

First Preferred Embodiment

Figure 1:
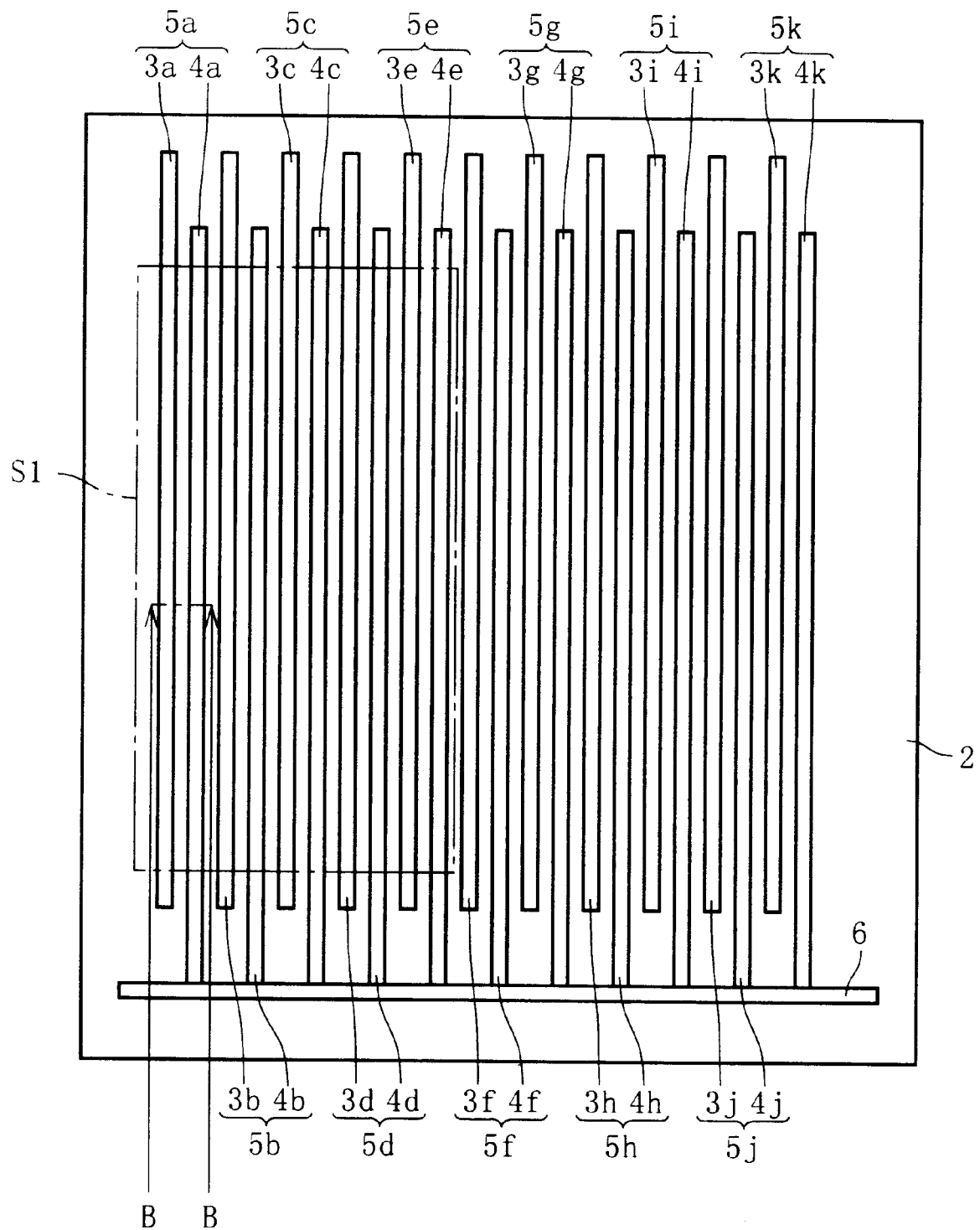
FIG. 1 is a top plan view of a semiconductor device according to a first preferred embodiment of the present invention.

FIG. 1 is a top plan view of a semiconductor device according to a first preferred embodiment of the present invention. Eleven first interconnect lines $3a$ to $3k$ (also referred to as "first conductor patterns" in the first preferred embodiment) and eleven second interconnect lines $4a$ to $4k$ (also referred to as "second conductor patterns" in the first preferred embodiment) are arranged alternately on an upper surface of an insulating film 2. The second interconnect lines $4a$ to $4k$ are connected to a third interconnect line 6 formed on the insulating film 2 and extending in a direction perpendicular to the longitudinal direction of the second interconnect lines $4a$ to $4k$. As a result, the second interconnect lines $4a$ to $4k$ and the third interconnect line 6 are electrically connected to each other. Each of the first interconnect lines $3a$ to $3k$, the second interconnect lines $4a$ to $4k$ and the third interconnect line 6 is an interconnect line of metal or doped polysilicon which is 0.2 μm in width and 10 μm in length. The first interconnect lines $3a$ to $3k$ are spaced 0.2 μm apart from the respectively associated second interconnect lines $4a$ to $4k$. In the arrangement shown in FIG. 1, the first interconnect lines $3a$ to $3k$ are paired with the second interconnect lines $4a$ to $4k$ adjacent to the first interconnect lines $3a$ to $3k$ to constitute a total of eleven test patterns $5a$ to $5k$, respectively.

In general, the magnitude of the electric capacity of an interconnect line formed an insulating film is proportional to the contact area of the interconnect line with the insulating film and the length of the interconnect line. When the electric capacity of each of the first interconnect lines $3a$ to $3k$ is given by C, the second interconnect lines $4a$ to $4k$ and the third interconnect line 6 which are electrically connected to each other as a whole have an electric capacity represented by 12C which is twelve times greater than C.

Figure 2:
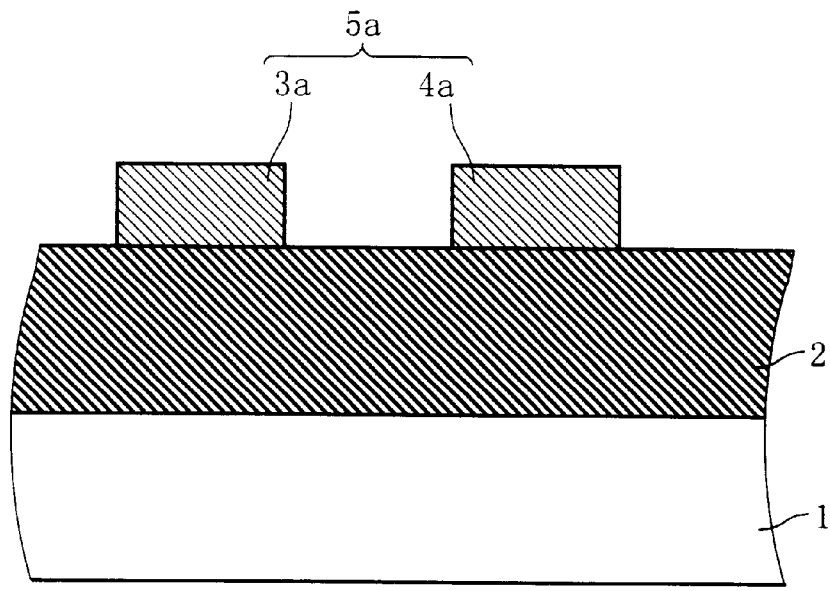
FIG. 2 is a cross-sectional view of the semiconductor device taken along the line B—B of FIG. 1.

FIG. 2 is a cross-sectional view of the semiconductor device taken along the line B—B of FIG. 1. The insulating film 2 is formed on the entire upper surface of a substrate 1. The first interconnect line $3a$ and the second interconnect line $4a$ are formed adjacent to each other on the upper surface of the insulating film 2. The first interconnect line $3a$ and the second interconnect line $4a$ are electrically isolated from the substrate 1 and are electrically floating. Although there is shown in FIG. 2 only a representative section of the semiconductor device of FIG. 1 in which the test pattern $5a$ comprised of the first interconnect line $3a$ and the second interconnect line $4a$ is formed, sections of the semiconductor device in which other test patterns $5b$ to $5k$ are formed are similar in construction to the section shown in FIG. 2. Specifically, the first interconnect lines $3a$ to $3k$ and the second interconnect lines $4a$ to $4k$ are electrically isolated from the substrate 1 and are electrically floating.

Figure 3:
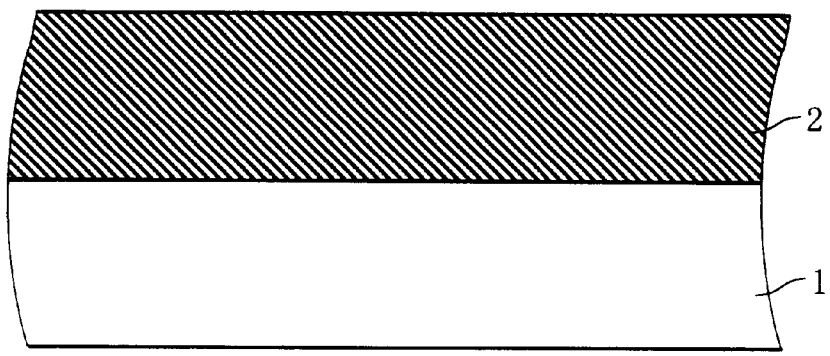
FIGS. 3 through 7 are cross-sectional views showing a method of manufacturing the semiconductor device shown in FIG. 2 in order of process steps.
Figure 4:
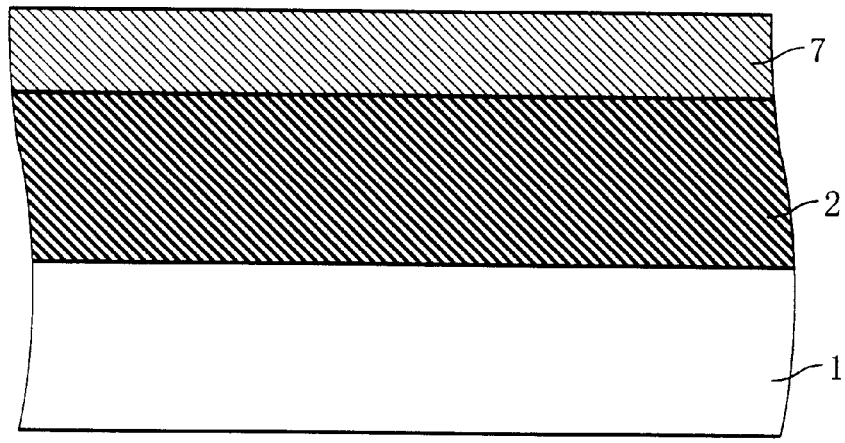
Figure 5:
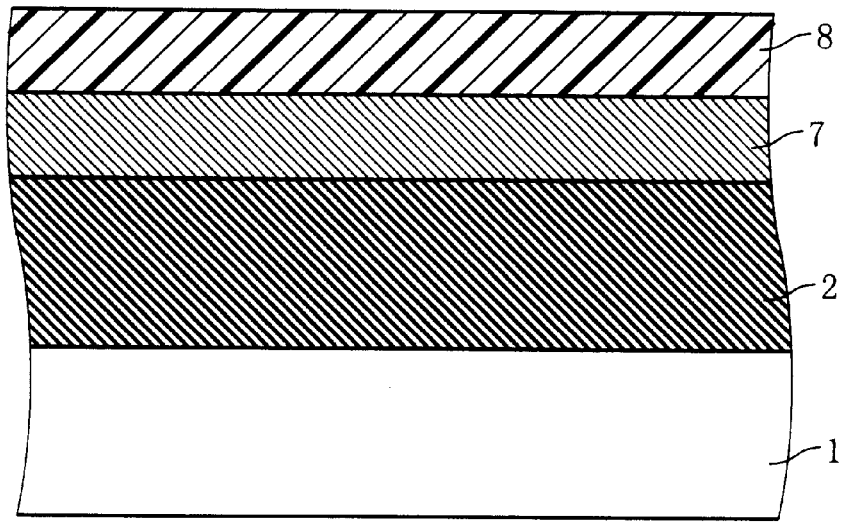
Figure 6:
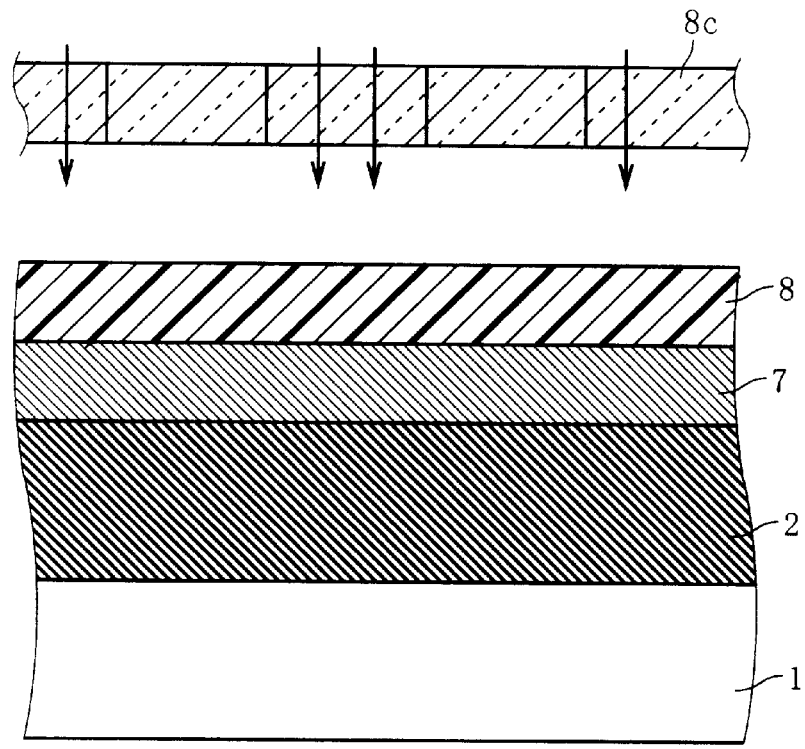
Figure 7:
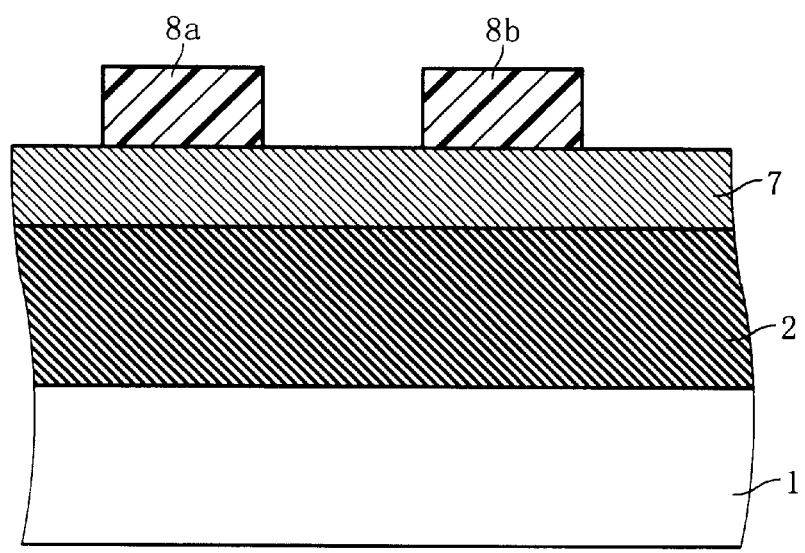

FIGS. 3 through 7 are cross-sectional views showing a method of manufacturing the semiconductor device shown in FIG. 2 in order of process steps. It is assumed herein that the first interconnect lines $3a$ to $3k$ and the second interconnect lines $4a$ to $4k$ are metal interconnect lines. First, the insulating film 2 is formed on the upper surface of the substrate 1 by the CVD process and the like (FIG. 3). Then, a metal film 7 is formed on the upper surface of the insulating film 2 by the CVD process and the like (FIG. 4). A photoresist 8 is applied to an upper surface of the metal film 7 (FIG. 5). The photoresist 8 is exposed to ultraviolet light, using a photomask $8c$ having a predetermined pattern (FIG. 6). Part of the photoresist 8 which is exposed to the ultraviolet light is removed. As a result, only photoresists $8a$ and $8b$ are left on the upper surface of the metal film 7 (FIG. 7). Using the photoresists $8a$ and $8b$ as a mask, anisotropic dry etching which exhibits a higher etch rate in a direction of the depth of the substrate 1 is performed on the metal film 7 to expose the upper surface of the insulating film 2. Consequently, parts of the metal film 7 which are not etched away are left as the first interconnect line $3a$ and the second interconnect line $4a$, respectively, on the upper surface of the insulating film 2. Thereafter, the photoresist $8a$ and $8b$ are removed. The semiconductor device shown in FIG. 2 is manufactured through these process steps.

Alignment of the photomask $8c$ with low precision or dry etching of the metal film 7 with low precision, for example, in the semiconductor device manufacturing steps causes the first interconnect line $3a$ and the second interconnect line $4a$ to come into contact with each other.

Referring again to FIG. 1, whether or not there is contact between the first interconnect lines $3a$ to $3k$ and the respectively associated second interconnect lines $4a$ to $4k$ may be evaluated by observing the surface of the semiconductor device through an electron microscope such as a SEM. Description will now be given on the evaluation of whether or not there is contact between the first interconnect lines $3a$ to $3e$ and the respectively associated second interconnect lines $4a$ to $4e$. Initially, a region S1 of the upper surface of the semiconductor device which contains the first interconnect lines $3a$ to $3e$ and the second interconnect lines $4a$ to $4e$ are irradiated with charged particles such as an electron beam. This causes electric charges to be injected into the first interconnect lines $3a$ to $3e$ and the second interconnect lines $4a$ to $4e$. These electric charges are distributed uniformly in the first interconnect lines $3a$ to $3e$ and the second interconnect lines $4a$ to $4e$. Each of the first interconnect lines $3a$ to $3e$ and the second interconnect lines $4a$ to $4e$ has a constant amount of charges Q.

Attention is given to the first interconnect line $3a$ and the second interconnect line $4a$, for example. If the first interconnect line $3a$ and the second interconnect line $4a$ are out of contact with each other, the electric capacity of the first interconnect line $3a$ equals the electric capacity C that the first interconnect line $3a$ possesses by itself. In this case, a potential V1 at the first interconnect line $3a$ is expressed by V1=Q/C. On the other hand, if the first interconnect line $3a$ and the second interconnect line $4a$ are in contact with each other, the electric capacity of the first interconnect line $3a$ equals the total electric capacity of the first interconnect line $3a$, the second interconnect lines $4a$ to $4k$ and the third interconnect line 6 which is expressed by 13C. The sum of the amounts of charges Q injected into the first interconnect line 3a and the second interconnect lines 4a to 4e is given by 6Q. In this case, a potential V2 at the first interconnect line 3a is expressed by V2=6Q/13C which is lower than the potential V1.

Thus, the potential at the first interconnect lines 3a to 3e irradiated with the charged particles differs depending on whether or not there is contact between the first interconnect lines 3a to 3e and the respectively associated second interconnect lines 4a to 4e. The amount of secondary electrons emitted from the first interconnect lines 3a to 3e differs depending on the level of the potential at the first interconnect lines 3a to 3e since the amount of secondary electrons emitted is determined by the potential when the same material is used. More specifically, an increased amount of secondary electrons is emitted from the first interconnect lines 3a to 3e at a decreased potential, whereas a decreased amount of secondary electrons is emitted from the first interconnect lines 3a to 3e at an increased potential.

When the region S1 shown in FIG. 1 is observed through the electron microscope, each of the first interconnect lines 3a to 3e appears as a dark image if it is out of contact with an associated one of the second interconnect lines 4a to 4e, and appears as a bright image if it is in contact therewith. The second interconnect lines 4a to 4k and the third interconnect line 6 as a whole have the large electric capacity given by 12C and are observed as a bright image. Therefore, the difference between the first interconnect lines 3a to 3e and the second interconnect lines 4a to 4e which are contained in the region S1 in the amount of secondary electrons emitted therefrom may be detected as a potential contrast and used to evaluate whether or not there is contact between the first interconnect lines 3a to 3e and the respectively associated second interconnect lines 4a to 4e.

A potential difference by a factor of two or greater between a contacting interconnect line and a non-contacting interconnect line is desirable for the detection of the difference in the amount of secondary electrons emitted based on whether or not there is contact between adjacent interconnect lines as the potential contrast. In the above-mentioned instance, it is desirable that the sum (13C) of the electric capacities of the first interconnect line 3a, the second interconnect lines 4a to 4k and the third interconnect line 6 is at least twice the sum (6C) of the electric capacities of the first interconnect line 3a and the second interconnect lines 4a to 4e contained in the region S1.

As described hereinabove, the semiconductor device according to the first preferred embodiment is designed such that the first and second conductor patterns are electrically isolated from the substrate. The first conductor patterns are irradiated with the charged particles, and the difference between the first conductor patterns in the amount of secondary electrons emitted therefrom in accordance with the electric capacity of the first conductor patterns is detected as the potential contrast and used to evaluate whether or not there is contact between the first and second conductor patterns. This eliminates the step of forming a contact hole for fixing the second conductor patterns at the substrate potential which has been performed in the method of manufacturing the background art semiconductor device.

Second Preferred Embodiment

Figure 8:
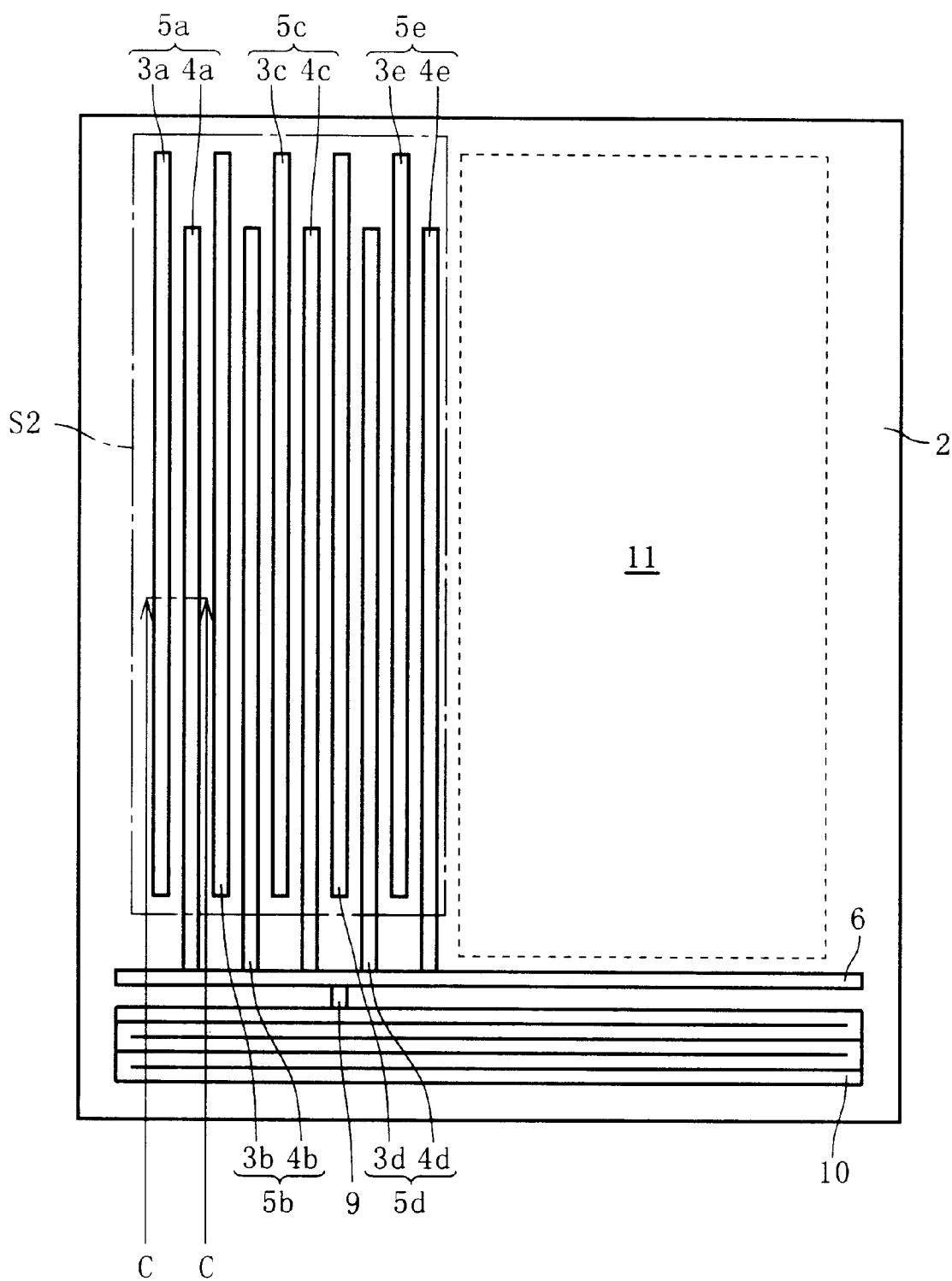
FIG. 8 is a top plan view of the semiconductor device according to a second preferred embodiment of the present invention.

FIG. 8 is a top plan view of the semiconductor device according to a second preferred embodiment of the present invention. Five first interconnect lines 3a to 3e (also referred to as "first conductor patterns" in the second preferred embodiment) and five second interconnect lines 4a to 4e (also referred to as "second conductor patterns" in the second preferred embodiment) are arranged alternately on the upper surface of the insulating film 2. In the arrangement shown in FIG. 8, the first interconnect lines 3a to 3e are paired with the second interconnect lines 4a to 4e adjacent to the first interconnect lines 3a to 3e to constitute a total of five test patterns Sa to 5e, respectively.

In the semiconductor device shown in FIG. 8, the first interconnect lines 3a to 3e are spaced 0.2 μm apart from the respectively associated second interconnect lines 4a to 4e. The second interconnect lines 4a to 4e are connected to the third interconnect line 6 formed on the insulating film 2 and extending in a direction perpendicular to the longitudinal direction of the second interconnect lines 4a to 4e. The third interconnect line 6 is connected through a fourth interconnect line 9 formed on the upper surface of the insulating film 2 to a fifth interconnect line 10 formed on the upper surface of the insulating film 2. As a result, the second interconnect lines 4a to 4e, the third interconnect line 6, the fourth interconnect line 9 and the fifth interconnect line 10 are electrically connected to each other.

Each of the first interconnect lines 3a to 3e, the second interconnect lines 4a to 4e and the third interconnect line 6 is an interconnect line of metal or doped polysilicon which is 0.2 μm in width and 10 μm in length. The fifth interconnect line 10 is an interconnect line of metal or doped polysilicon which is 0.2 μm in width and 50 μm in length. Alternatively, the fifth interconnect line 10 may be a conductive film which is 1.0 μm in width and 10 μm in length. Additionally, the third interconnect line 6 and the fifth interconnect line 10 may be integrally formed without using the fourth interconnect line 9.

When the electric capacity of each of the first interconnect lines 3a to 3e is given by C, the fifth interconnect line 10 has an electric capacity represented by 5C which is five times greater than C, and the second interconnect lines 4a to 4e, the third interconnect line 6 and the fifth interconnect line 10 which are electrically connected to each other as a whole have an electric capacity represented by 11C. The electric capacity of the fourth interconnect line 9 is neglected herein since the fourth interconnect line 9 has a sufficiently shorter length relative to the length of the third interconnect line 6 and others.

A cross-section of the semiconductor device taken along the line C—C of FIG. 8 appears similar in construction to the cross-section of the semiconductor device of the first preferred embodiment shown in FIG. 2. The semiconductor device according to the second preferred embodiment is manufactured through the sequential process steps of FIGS. 3 through 7 described with respect to the first preferred embodiment.

A region S2 of the upper surface of the semiconductor device which contains the first interconnect lines 3a to 3e and the second interconnect lines 4a to 4e is irradiated with charged particles such as an electron beam in a manner described in the first preferred embodiment. Then, if there is no contact between the first interconnect lines 3a to 3e and the respectively associated second interconnect lines 4a to 4e, the potential V1 at the first interconnect lines 3a to 3e is expressed by V1=Q/C. On the other hand, if the first interconnect line 3a and the second interconnect line 4a are in contact with each other, the potential V2 at the first interconnect line 3a is expressed by V2=6Q/12C.

As described in the first preferred embodiment, the potential difference by a factor of two or greater between a contacting interconnect line and a non-contacting interconnect line is desirable for the detection of the difference in the amount of secondary electrons emitted based on whether or not there is contact between adjacent interconnect lines as the potential contrast. In the above-mentioned instance, it is desirable that the sum (12C) of the electric capacities of the first interconnect line 3a, the second interconnect lines 4a to 4e, the third interconnect line 6 and the fifth interconnect line 10 is at least twice the sum (6C) of the electric capacities of the first interconnect line 3a and the second interconnect lines 4a to 4e contained in the region S2.

As described hereinabove, the semiconductor device and the method of evaluating the semiconductor device according to the second preferred embodiment is such that a conductor region having a large electric capacity is formed in electrically isolated relationship with the substrate and is electrically connected to the second conductor patterns. This eliminates the need to form the six test patterns 5f to 5k, which are provided in the semiconductor device of the first preferred embodiment, on the upper surface of the semiconductor device to reduce the area for the formation of the test patterns by the area of a region 11 shown in FIG. 8 (about 3 $\mu m^2$ in this case).

Accordingly, there is no need to irradiate the region 11 shown in FIG. 8 with the charged particles such as the electron beam when the surface of the semiconductor device is observed through the electron microscope. Thus, the region irradiated with the charged particles in the semiconductor device of the second preferred embodiment is smaller than that in the semiconductor device of the first preferred embodiment shown in FIG. 1.

Additionally, all of the first interconnect lines 3a to 3e and the second interconnect lines 4a to 4e formed on the surface of the semiconductor device may be irradiated with the charged particles at the same time.

Third Preferred Embodiment

Figure 9:
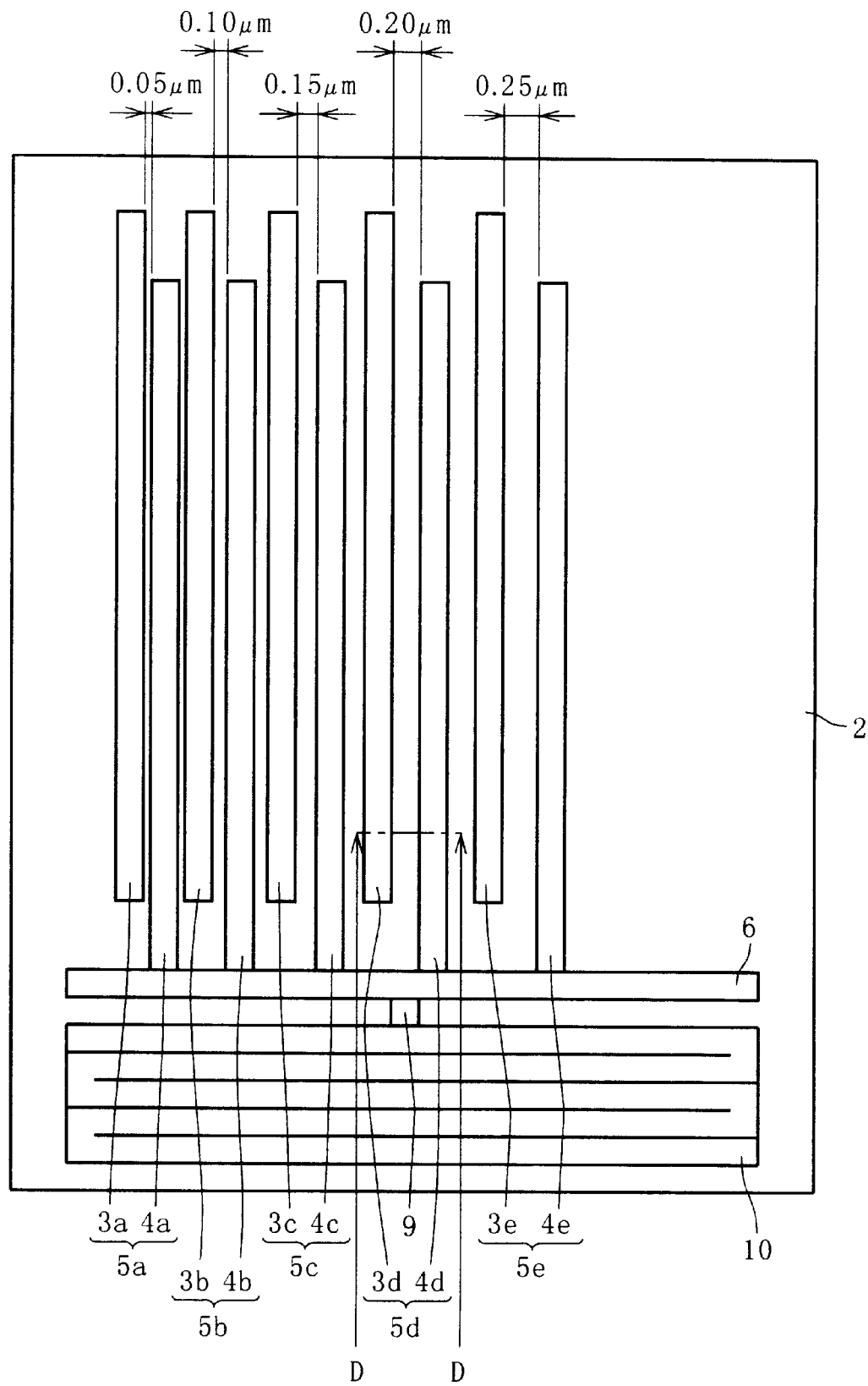
FIG. 9 is a top plan view of the semiconductor device according to a third preferred embodiment of the present invention.

FIG. 9 is a top plan view of the semiconductor device according to a third preferred embodiment of the present invention. According to the third preferred embodiment, the first interconnect lines 3a to 3e (also referred to as "first conductor patterns" in the third preferred embodiment) and the respectively associated second interconnect lines 4a to 4e (also referred to as "second conductor patterns" in the third preferred embodiment) which are provided in the semiconductor device of the second preferred embodiment shown in FIG. 8 are arranged so that the spacings therebetween are changed stepwise in increments of 0.05 $\mu m$ in a range from 0.05 $\mu m$ to 0.25 $\mu m$. The remaining structure of the semiconductor device of the third preferred embodiment is similar to that of the semiconductor device of the second preferred embodiment shown in FIG. 8.

A cross-section of the semiconductor device taken along the line D—D of FIG. 9 appears similar in construction to the cross-section of the semiconductor device of the first preferred embodiment shown in FIG. 2 although a cross-section in which the first interconnect line 3d and the second interconnect line 4d are formed is taken along the line D—D of FIG. 9 whereas the cross-section in which the first interconnect line 3a and the second interconnect line 4a are formed is shown in FIG. 2. The semiconductor device according to the third preferred embodiment is manufactured through the sequential process steps of FIGS. 3 through 7 described with respect to the first preferred embodiment.

As described hereinabove, the semiconductor device according to the third preferred embodiment includes the plurality of test patterns having the stepwise changed spacings between the first conductor patterns and the respectively associated second conductor patterns. Then, if the observation of the semiconductor device of the third preferred embodiment through the electron microscope shows, for example, that there is contact between the first and second conductor patterns in the test patterns 5a to 5c but there is no contact between the first and second conductor patterns in the test patterns 5d and 5e, it is found that a minimum spacing of 0.20 $\mu m$ allows the first and second conductor patterns to be arranged in non-contacting relationship in the photolithographic technique employed for the formation of the semiconductor device. The semiconductor device of the third preferred embodiment can be used by itself to determine the minimum spacing between adjacent interconnect lines in non-contacting relationship.

Figure 10:
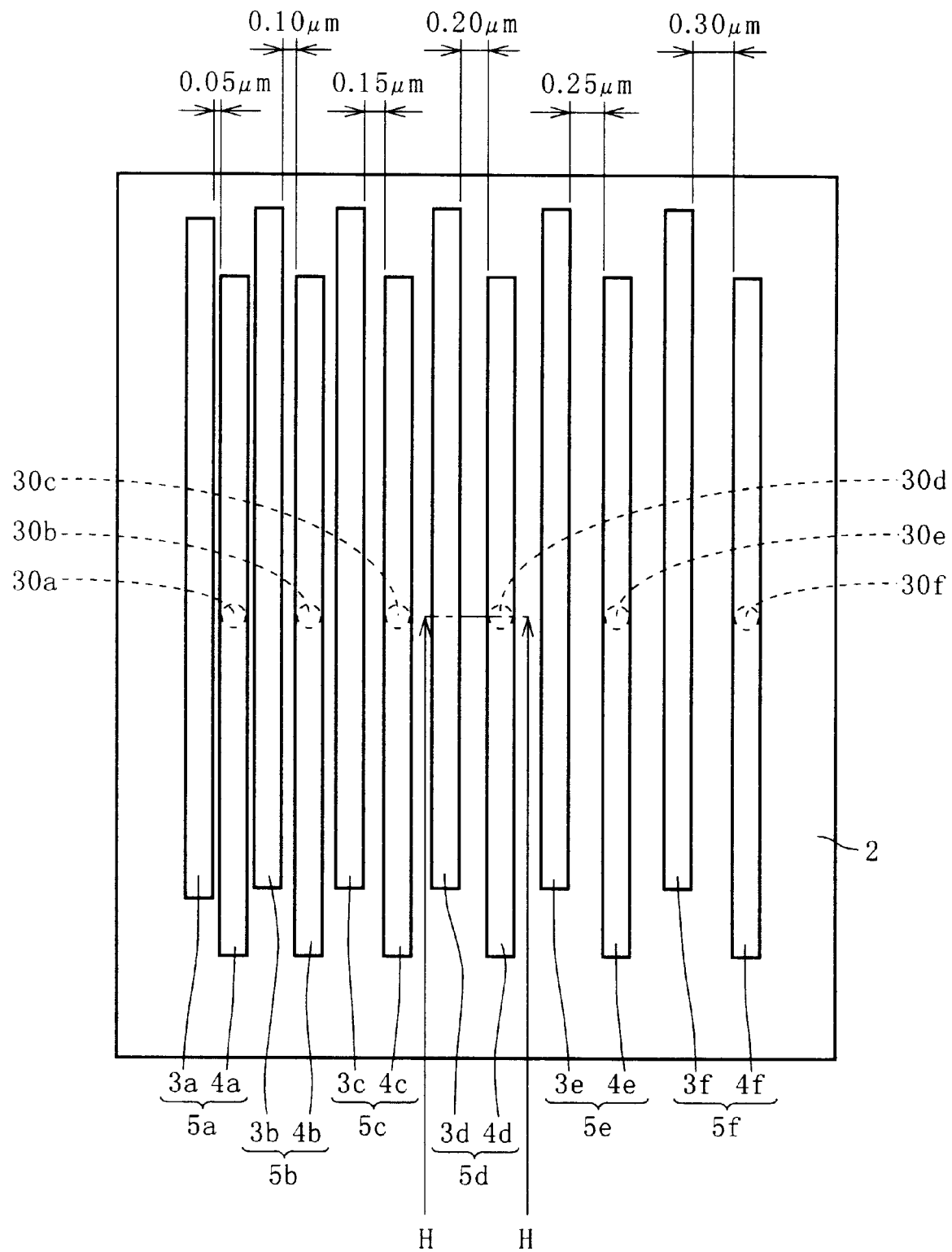
FIG. 10 is a top plan view of the semiconductor device in another form according to the third preferred embodiment of the present invention.
Figure 11:
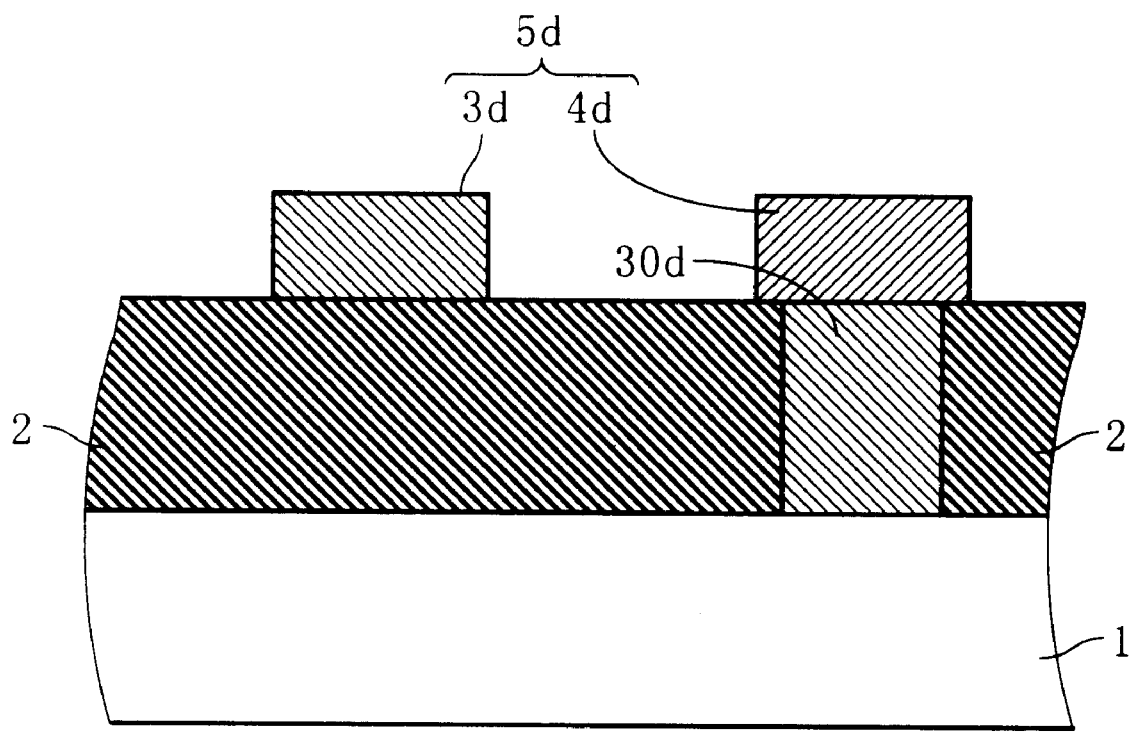
FIG. 11 is a cross-sectional view of the semiconductor device taken along the line H—H of FIG. 10.

FIG. 10 is a top plan view of the semiconductor device in another form according to the third preferred embodiment of the present invention. FIG. 11 is a cross-sectional view of the semiconductor device taken along the line H—H of FIG. 10. As illustrated in FIG. 11, the second interconnect line 4d is electrically connected through a contact hole 30d filled with a conductor to the substrate 1. Although there is shown in FIG. 11 only a representative section of the semiconductor device of FIG. 10 in which the test pattern 5d comprised of the first interconnect line 3d and the second interconnect line 4d is formed, sections of the semiconductor device in which other test patterns 5a to 5c, 5e, and 5f are formed are similar in construction to the section shown in FIG. 11. The semiconductor device having such a structure may also be designed such that the test patterns 5a to 5f have stepwise changed spacings between the first interconnect lines 3a to 3f and the respectively associated second interconnect lines 4a to 4f, thereby producing the above described effects.

Fourth Preferred Embodiment

Figure 12:
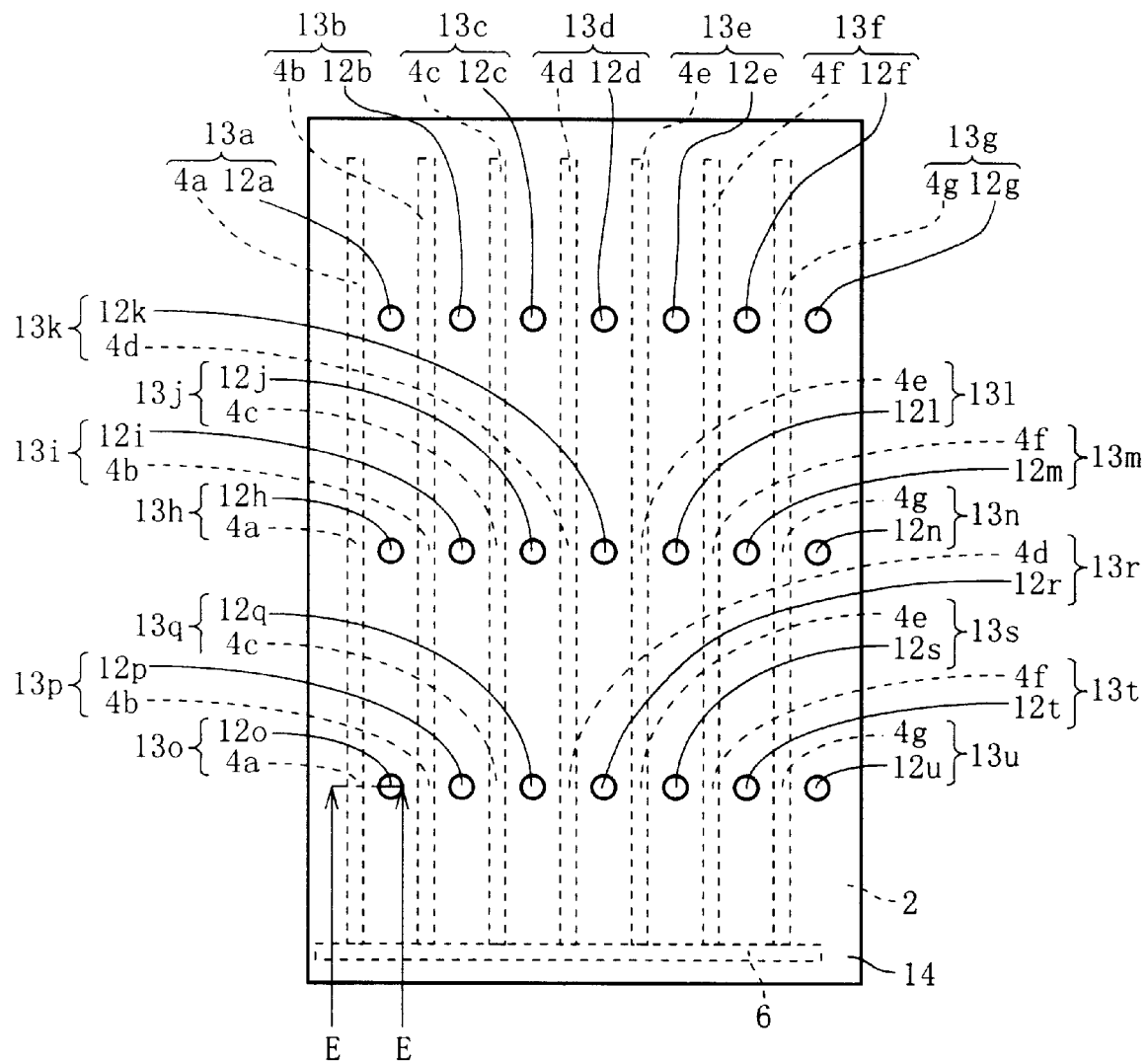
FIG. 12 is a top plan view of the semiconductor device according to a fourth preferred embodiment of the present invention.
Figure 13:
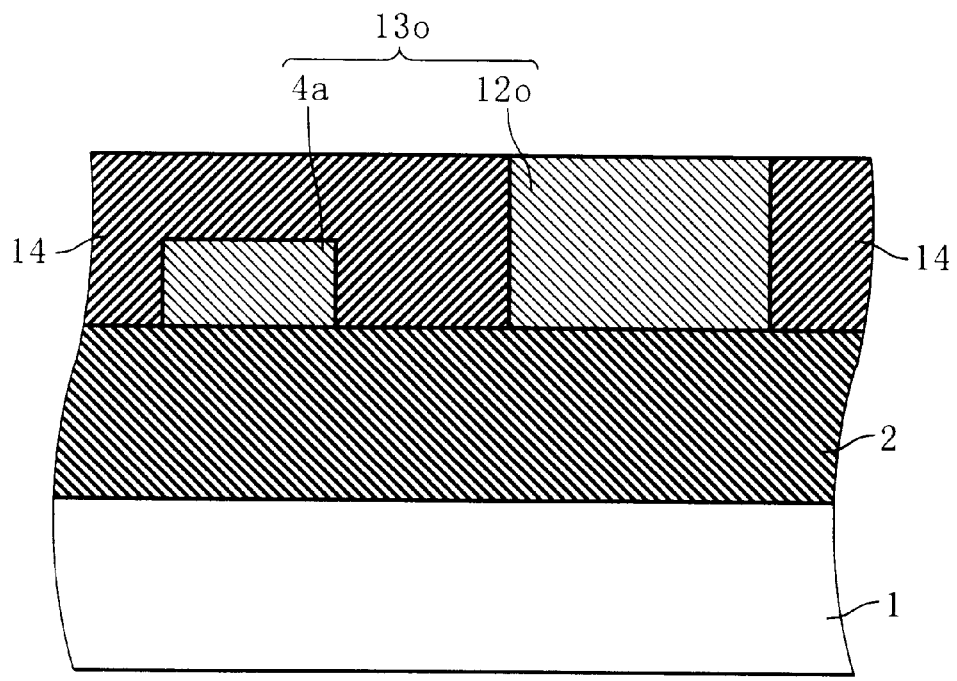
FIG. 13 is a cross-sectional view of the semiconductor device taken along the line E—E of FIG. 12.

FIG. 12 is a top plan view of the semiconductor device according to a fourth preferred embodiment of the present invention. FIG. 13 is a cross-sectional view of the semiconductor device taken along the line E—E of FIG. 12. Referring to FIG. 13, the insulating film 2 is formed on the entire upper surface of the substrate 1. The second interconnect line 4a is formed on the upper surface of the insulating film 2. An insulating film 14 is formed on the entire upper surface of the insulating film 2. A contact hole 12o filled with a conductor is formed adjacent to the second interconnect line 4a and extends through the insulating film 14 between the upper surface of the insulating film 14 and the upper surface of the insulating film 2. The second interconnect line 4a and the contact hole 12o are electrically isolated from the substrate 1 and are electrically floating. Although there is shown in FIG. 13 only a representative section of the semiconductor device of FIG. 12 in which a test pattern 13o comprised of the second interconnect line 4a and the contact hole 12o is formed, sections of the semiconductor device in which other test patterns 13a to 13n, and 13p to 13u are formed are similar in construction to the section shown in FIG. 13. Specifically, the second interconnect lines 4a to 4f and the contact holes 12a to 12u are electrically isolated from the substrate 1 and are electrically floating.

With reference to FIG. 12, seven second interconnect lines 4a to 4g (also referred to as "second conductor patterns" in the fourth preferred embodiment) are formed on the upper surface of the insulating film 2. A total of 21 contact holes 12a to 12u (also referred to as "first conductor patterns" in the fourth preferred embodiment) are arranged such that three of the contact holes 12a to 12u alternate with each of the second interconnect lines 4a to 4g adjacent thereto. For example, the contact holes 12a, 12h and 12o are disposed adjacent to the second interconnect line 4a, and the contact holes 12b, 12i and 12p are disposed adjacent to the interconnect line 4b. As a result, a total of 21 test patterns 13a to 13u are formed in the arrangement shown in FIG. 12. The second interconnect lines 4a to 4g are spaced 0.2 μm apart from the respectively associated contact holes 12a to 12u. The contact holes 12a to 12u have a diameter of 0.3 μm. For ease of observation through the electron microscope, a conductor region having a surface area greater than the area of the upper surface of each of the contact holes 12a to 12u may be formed on each of the contact holes 12a to 12u.

The second interconnect lines 4a to 4g are connected to the third interconnect line 6 formed on the insulating film 2 and extending in a direction perpendicular to the longitudinal direction of the second interconnect lines 4a to 4g. As a result, the second interconnect lines 4a to 4g and the third interconnect line 6 are electrically connected to each other. Each of the second interconnect lines 4a to 4g and the third interconnect line 6 is an interconnect line of metal or doped polysilicon which is 0.2 μm in width and 10 μm in length. When the electric capacity of each interconnect line which is 0.2 μm in width and 10 μm in length is given by C, the second interconnect lines 4a to 4g and the third interconnect line 6 which are electrically connected to each other as a whole have an electric capacity represented by 8C which is eight times greater than C. Each of the contact holes 12a to 12u shall have an electric capacity expressed by C0.

Figure 14:
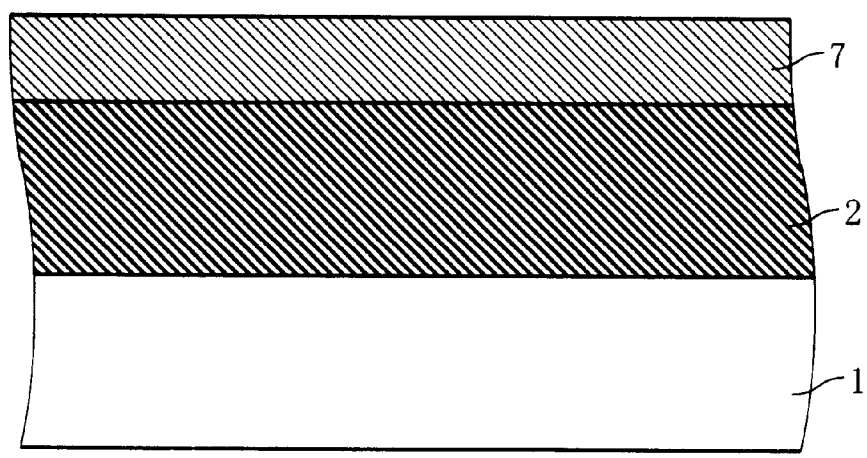
FIGS. 14 through 22 are cross-sectional views showing a method of manufacturing the semiconductor device shown in FIG. 13 in order of process steps.
Figure 15:
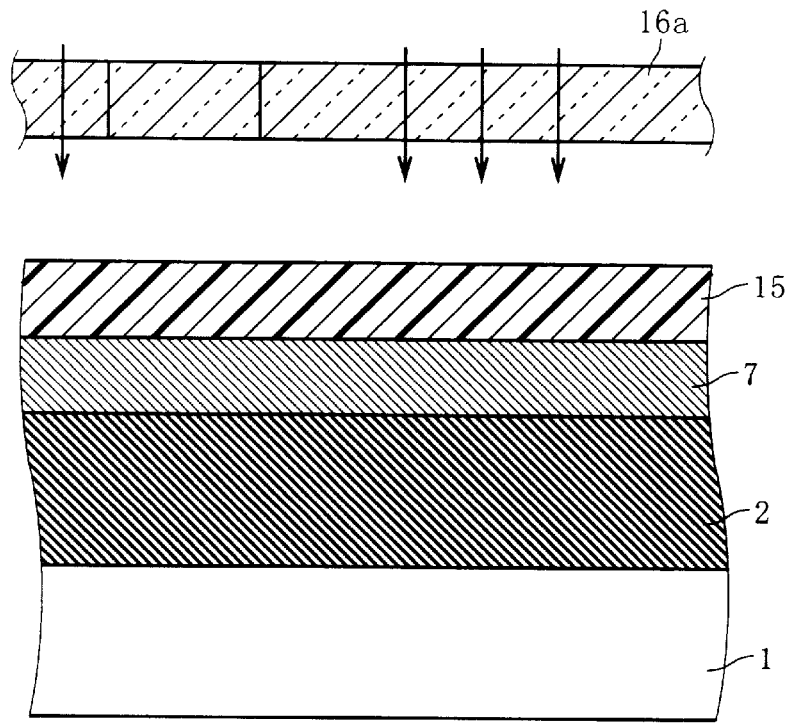

FIGS. 14 through 22 are cross-sectional views showing a method of manufacturing the semiconductor device shown in FIG. 13 in order of process steps. It is assumed herein that the second interconnect lines 4a to 4g are metal interconnect lines. First, the insulating film 2 is formed on the upper surface of the substrate 1 by the CVD process and the like, and thereafter the metal film 7 is formed on the upper surface of the insulating film 2 by the CVD process and the like (FIG. 14). A photoresist 15 is applied to the upper surface of the metal film 7, and is exposed to ultraviolet light, using a photomask 16a having a predetermined pattern (FIG. 15).

Figure 16:
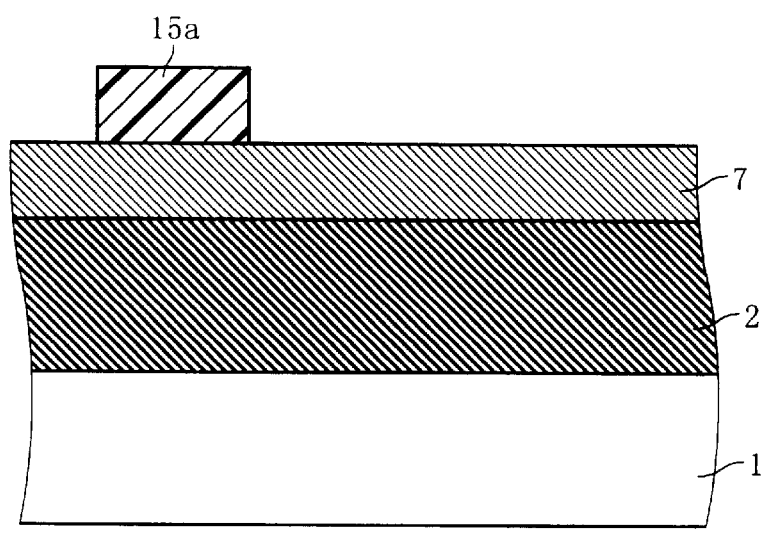
Figure 17:
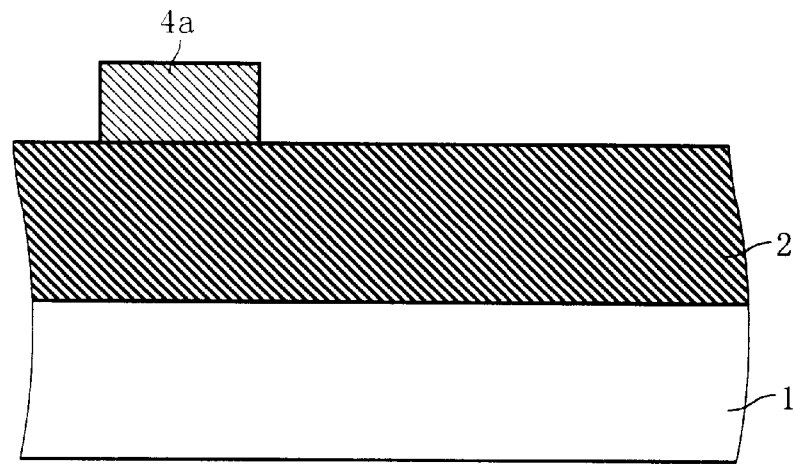

Next, part of the photoresist 15 which is exposed to the ultraviolet light is removed. As a result, only a photoresist 15a is left on the upper surface of the metal film 7 (FIG. 16). Using the photoresist 15a as a mask, anisotropic dry etching which exhibits a higher etch rate in a direction of the depth of the substrate 1 is performed on the metal film 7 to expose the upper surface of the insulating film 2. Consequently, part of the metal film 7 which is not etched away is left as the second interconnect line 4a on the upper surface of the insulating film 2. Thereafter, the photoresist 15a is removed (FIG. 17).

Figure 18:
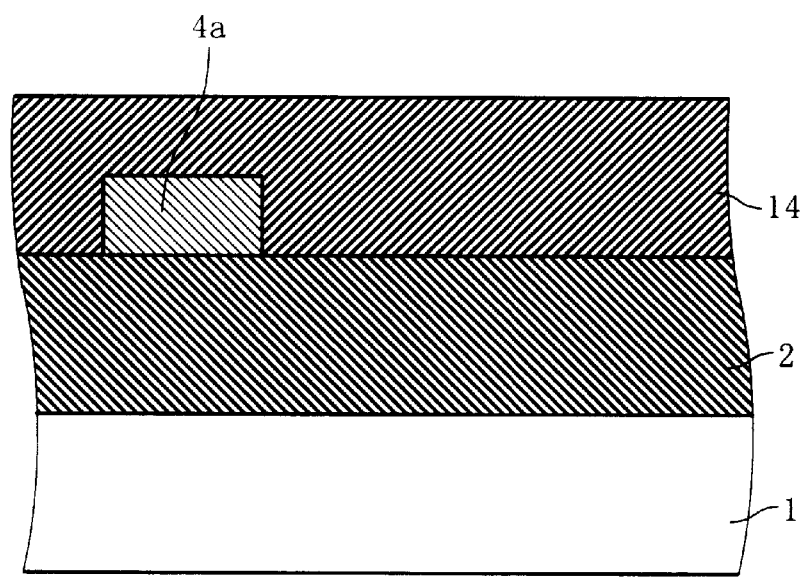
Figure 19:
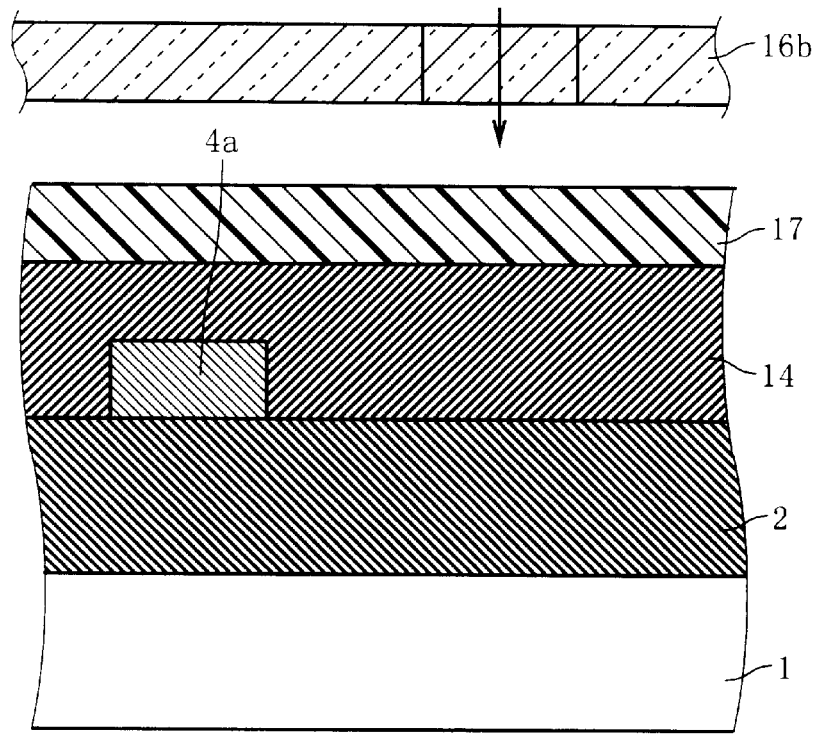
Figure 20:
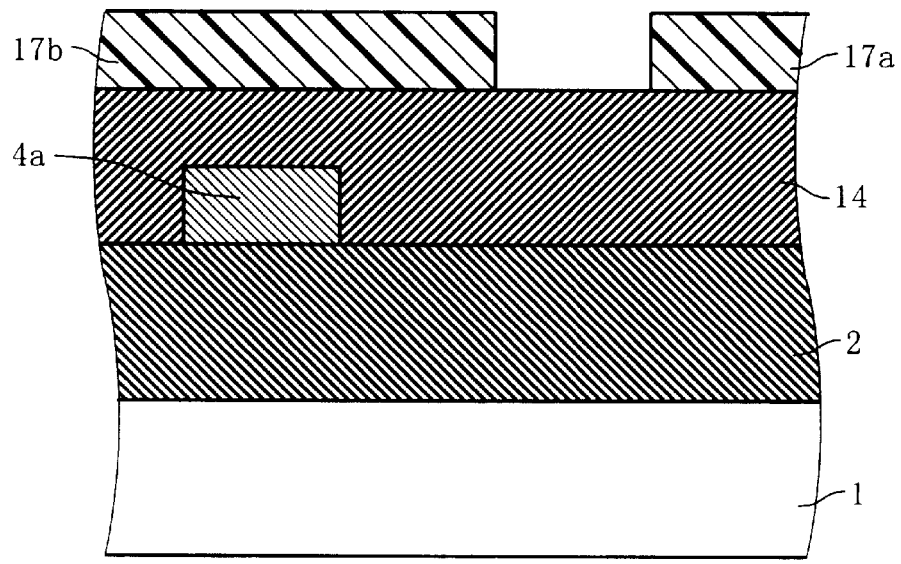
Figure 21:
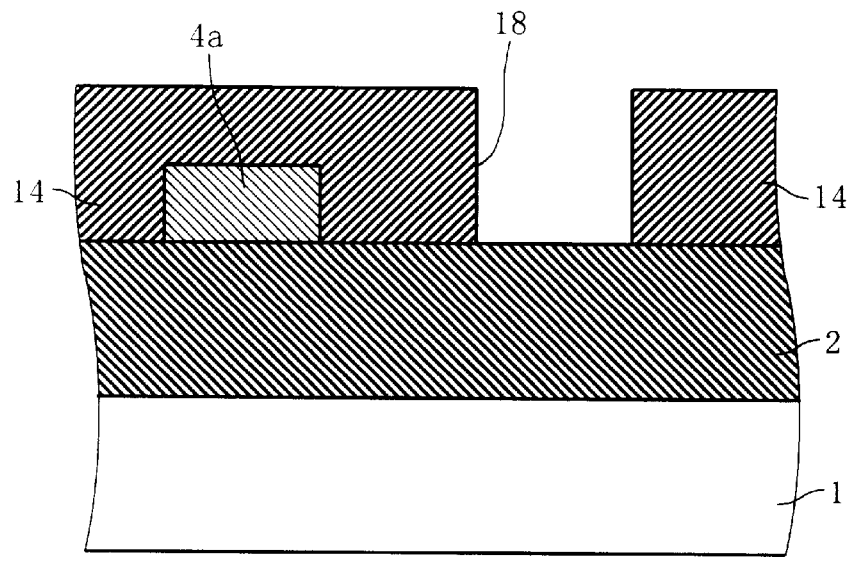

The insulating film 14 is formed on the entire top surface of a resultant structure by the CVD process and the like (FIG. 18). A photoresist 17 is applied to the upper surface of the insulating film 14, and is exposed to ultraviolet light, using a photomask 16b having a predetermined pattern (FIG. 19). Next, part of the photoresist 17 which is exposed to the ultraviolet light is removed. As a result, only photoresists 17a and 17b are left on the upper surface of the insulating film 14 (FIG. 20). Using the photoresists 17a and 17b as a mask, anisotropic dry etching which exhibits a higher etch rate in a direction of the depth of the substrate 1 is performed on the insulating film 14 to expose the upper surface of the insulating film 2. This forms a contact hole 18 extending through the insulating film 14 from the upper surface of the insulating film 14 to the upper surface of the insulating film 2. Thereafter, the photoresists 17a and 17b are removed (FIG. 21).

Figure 22:
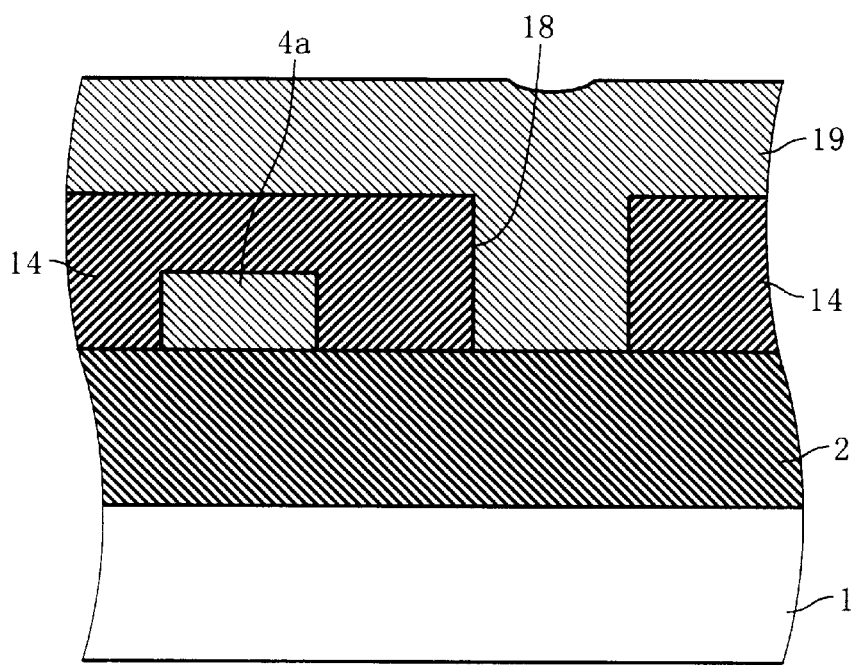

A metal film 19 is formed on the entire top surface of a resultant structure by the CVD process and the like (FIG. 22). The CMP (Chemical Mechanical Polishing) process and the like is performed to polish the metal film 19 until the upper surface of the insulating film 14 is exposed, and to planarize the surface of the metal film 19. The contact hole 18 filled with the metal film 19 serves as the contact hole 12o. The semiconductor device shown in FIG. 13 is manufactured through these process steps.

Alignment of the photomasks 16a and 16b with low precision or dry etching of the insulating film 14 for the formation of the contact hole 18 with low precision, for example, in the semiconductor device manufacturing steps causes the contact hole 12o and the second interconnect line 4a to come into contact with each other.

Referring again to FIG. 12, whether or not there is contact between the second interconnect lines 4a to 4g and the respectively associated contact holes 12a to 12u may be evaluated by observing the surface of the semiconductor device through an electron microscope such as a SEM. More specifically, the upper surface of the semiconductor device is irradiated with charged particles such as an electron beam. This causes electric charges to be injected into the contact holes 12a to 12u. These electric charges are distributed uniformly in the contact holes 12a to 12u. Each of the contact holes 12a to 12u has a constant amount of charges Q.

Attention is given to the contact hole 12o and the second interconnect line 4a, for example. If the contact hole 12o and the second interconnect line 4a are out of contact with each other, the electric capacity of the contact hole 12o equals the electric capacity C0 that the contact hole 12o possesses by itself. In this case, the potential V1 at the contact hole 12o is expressed by V1=Q/C0. On the other hand, if the contact hole 12o and the second interconnect line 4a are in contact with each other, the electric capacity of the contact hole 12o equals the total electric capacity (8C+C0) of the contact hole 12o, the second interconnect lines 4a to 4g and the third interconnect line 6. That is, the electric connections established by the third interconnect line 6 between the second interconnect lines 4a to 4g allow the second interconnect line 4b to 4g and the third interconnect line 6 in this instance, similar to the fifth interconnect line 10 shown in FIG. 8, to function to sufficiently increase the electric capacity of the second interconnect line 4a relative to the electric capacity of the contact hole 12o. In this case, the potential V2 at the contact hole 12o is expressed by V2=Q/(8C+C0) which is lower than the potential V1.

Thus, the potential at the contact holes 12a to 12u irradiated with the charged particles differs depending on whether or not there is contact between the second interconnect lines 4a to 4g and the respectively associated contact holes 12a to 12u. The amount of secondary electrons emitted from the contact holes 12a to 12u differs depending on the level of the potential at the contact holes 12a to 12u.

When the surface of the semiconductor device shown in FIG. 12 is observed through the electron microscope, each of the contact holes 12a to 12u appears as a dark image if it is out of contact with an associated one of the second interconnect lines 4a to 4g, and appears as a bright image if it is in contact therewith. Therefore, the difference between the contact holes 12a to 12u in the amount of secondary electrons emitted therefrom may be detected as a potential contrast and used to evaluate whether or not there is contact between the second interconnect lines 4a to 4g and the respectively associated contact holes 12a to 12u.

A potential difference by a factor of two or greater between a contacting contact hole and a non-contacting contact hole is desirable for the detection of the difference in the amount of secondary electrons emitted based on whether or not there is contact between the contact holes and the interconnect line which are adjacent to each other as the potential contrast. In the above-mentioned instance, it is desirable that the sum (8C+C0) of the electric capacities of the contact hole 12o, the second interconnect lines 4a to 4g and the third interconnect line 6 is at least twice the electric capacity (C0) of the contact hole 12o. In the above description, the seven second interconnect lines 4a to 4g are formed to provide the sufficiently greater total electric capacity of the second interconnect lines 4a to 4g and the third interconnect line 6 relative to the electric capacity of each of the contact holes 12a to 12u. However, less than seven second interconnect lines 4a to 4g may be formed as far as these conditions are satisfied.

As described hereinabove, the semiconductor device according to the fourth preferred embodiment is designed such that the first and second conductor patterns are electrically isolated from the substrate. This eliminates the step of forming a contact hole for fixing the second conductor patterns at the substrate potential which has been performed in the method of manufacturing the background art semiconductor device.

Fifth Preferred Embodiment

Figure 23:
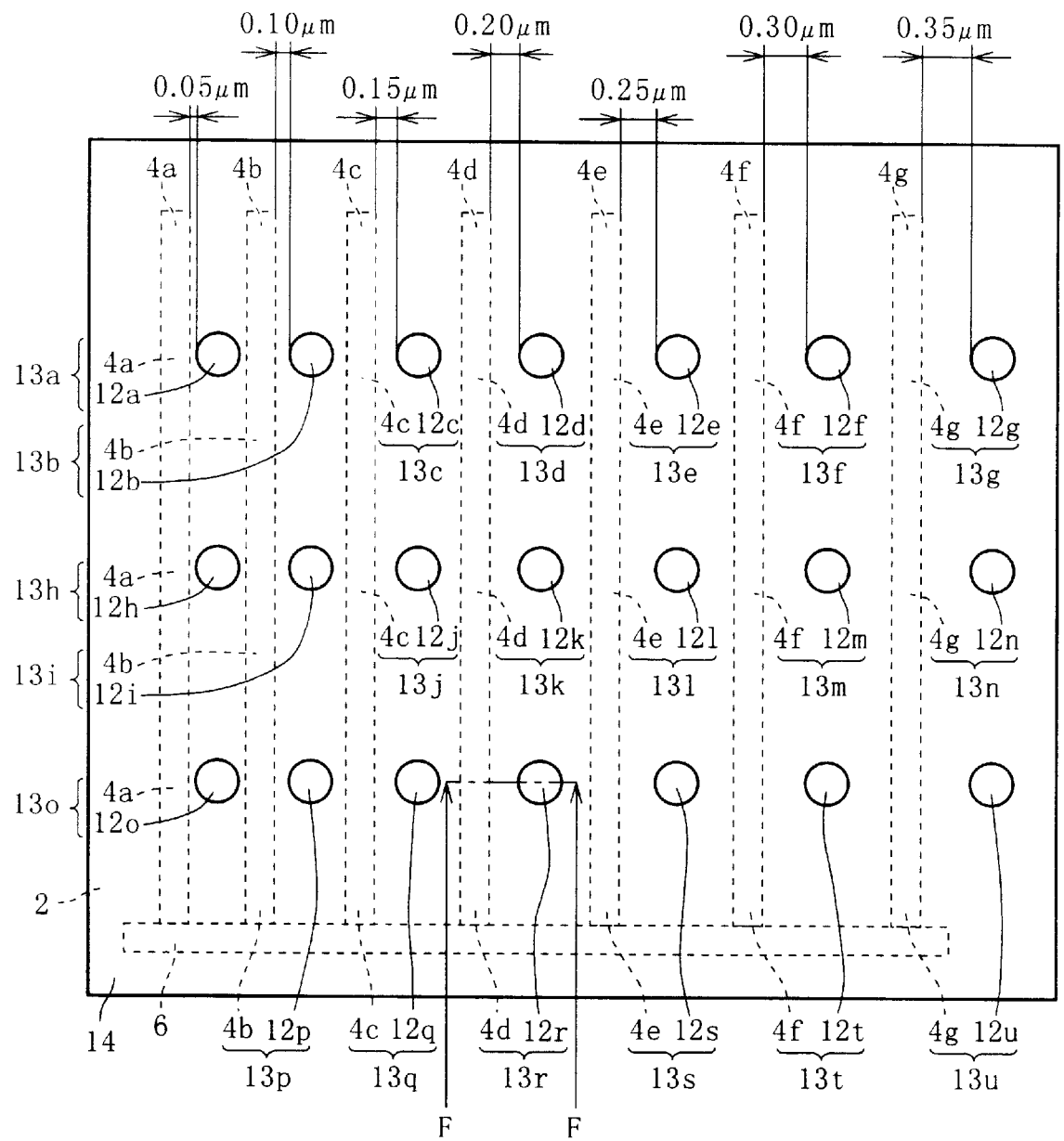
FIG. 23 is a top plan view of the semiconductor device according to a fifth preferred embodiment of the present invention.

FIG. 23 is a top plan view of the semiconductor device according to a fifth preferred embodiment of the present invention. A cross-section of the semiconductor device taken along the line F—F of FIG. 23 appears similar in construction to the cross-section of the semiconductor device of the fourth preferred embodiment shown in FIG. 13 although a cross-section in which the contact hole 12r and the second interconnect line 4d are formed is taken along the line F—F of FIG. 23 whereas the cross-section in which the contact hole 12o and the second interconnect line 4a are formed is shown in FIG. 13. The semiconductor device according to the fifth preferred embodiment is manufactured through the sequential process steps of FIGS. 14 through 22 described with respect to the fourth preferred embodiment.

With reference to FIG. 23, the semiconductor device according to the fifth preferred embodiment is designed such that the second interconnect lines 4a to 4g (also referred to as "second conductor patterns" in the fifth preferred embodiment) and the respectively associated contact holes 12a to 12u (also referred to as "first conductor patterns" in the fifth preferred embodiment) which are provided in the semiconductor device of the fourth preferred embodiment shown in FIG. 12 are arranged so that the spacings therebetween are changed stepwise in increments of 0.05 µm in a range from 0.05 µm to 0.35 µm. For example, the spacing between the second interconnect line 4a and the contact holes 12a, 12h, 12o is 0.05 µm, and the spacing between the second interconnect line 4b and the contact holes 12b, 12i, 12p is 0.10 µm. The remaining structure of the semiconductor device of the fifth preferred embodiment shown in FIG. 23 is similar to that of the semiconductor device of the fourth preferred embodiment shown in FIG. 12.

As described hereinabove, the semiconductor device according to the fifth preferred embodiment includes the plurality of test patterns having the stepwise changed spacings between the first conductor patterns and the respectively associated second conductor patterns. Then, if the observation of the semiconductor device of the fifth preferred embodiment through the electron microscope shows, for example, that there is contact between the contact holes and the interconnect line which are adjacent to each other in the test patterns 13a to 13c, 13h to 13j, and 13o to 13q but there is no contact therebetween in the test patterns 13d to 13g, 13k to 13n, and 13r to 13u, it is found that a minimum spacing of 0.20 µm allows the first and second conductor patterns to be arranged in non-contacting relationship in the photolithographic technique employed for the formation of the semiconductor device. The semiconductor device of the fifth preferred embodiment can be used by itself to determine the minimum spacing between the contact holes and the interconnect line which are adjacent to each other in non-contacting relationship.

Sixth Preferred Embodiment

Figure 25:
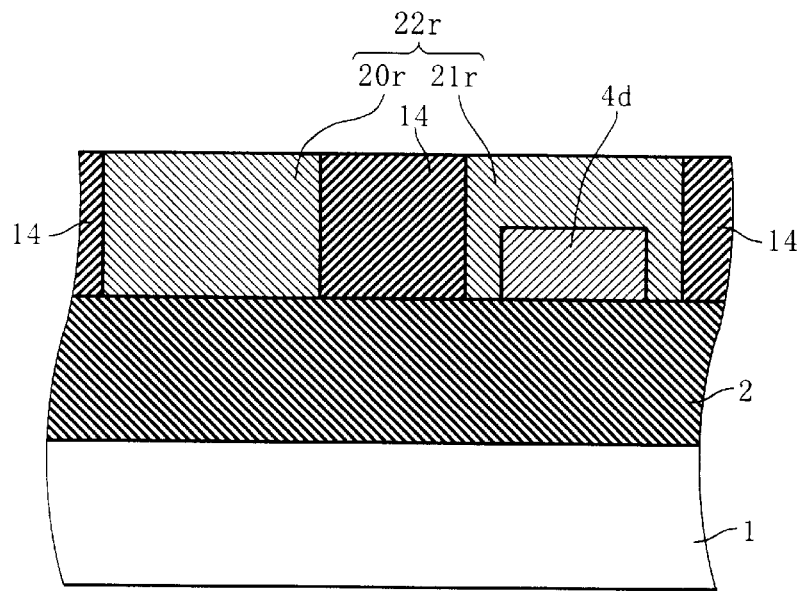
FIG. 25 is a cross-sectional view of the semiconductor device taken along the line G—G of FIG. 24.

FIG. 24 is a top plan view of the semiconductor device according to a sixth preferred embodiment of the present invention. FIG. 25 is a cross-sectional view of the semiconductor device taken along the line G—G of FIG. 24. Referring to FIG. 25, the insulating film 2 is formed on the entire upper surface of the substrate 1. The second interconnect line 4d is formed on the upper surface of the insulating film 2. The insulating film 14 is formed on the entire upper surface of the insulating film 2. A contact hole 21r filled with a conductor is formed extending through the insulating film 14 between the upper surface of the insulating film 14 and the upper surface of the insulating film 2 where the second interconnect line 4d is formed. A contact hole 20r filled with a conductor is formed adjacent to the contact hole 21r and extends through the insulating film 14 between the upper surface of the insulating film 14 and the upper surface of the insulating film 2. The contact holes 20r, 21r and the second interconnect line 4d are electrically isolated from the substrate 1 and are electrically floating. Although there is shown in FIG. 25 only a representative section of the semiconductor device of FIG. 24 in which a test pattern 22r comprised of the contact holes 20r and 21r is formed, sections of the semiconductor device in which other test patterns 22a to 22q, and 22s to 22u are formed are similar in construction to the section shown in FIG. 25. Specifically, the contact holes 20a to 20u, and 21a to 21u are electrically isolated from the substrate 1 and are electrically floating.

With reference to FIG. 24, seven second interconnect lines 4a to 4g are formed on the insulating film 2. The second interconnect lines 4a to 4g are connected to the third interconnect line 6 formed on the insulating film 2 and extending in a direction perpendicular to the longitudinal direction of the second interconnect lines 4a to 4g. Each of the second interconnect lines 4a to 4g and the third interconnect line 6 is an interconnect line of metal or doped polysilicon which is 0.2 µm in width and 10 µm in length. A total of 21 contact holes 20a to 20u (also referred to as "first conductor patterns" in the sixth preferred embodiment) and a total of 21 contact holes 21a to 21u (also referred to as "second conductor patterns" in the sixth preferred embodiment) are arranged alternately in the insulating film 14. The contact holes 20a to 20u are paired with the contact holes 21a to 21u, respectively. As a result, a total of 21 test patterns 22a to 22u are formed in the arrangement shown in FIG. 24. The contact holes 20a to 20u, and 21a to 21u have a diameter of 0.3 µm. The contact holes 20a to 20u are spaced 0.2 µm apart from the respectively associated contact holes 21a to 21u.

Three of the contact holes 21a to 21u are electrically connected to each of the interconnect lines 4a to 4g. For example, the contact holes 21a, 21h and 21o are electrically connected to the second interconnect line 4a, and the contact holes 21b, 21i and 21p are electrically connected to the interconnect line 4b. As a result, the contact holes 21a to 21u are electrically connected to each other through the second interconnect lines 4a to 4g and the third interconnect line 6. When the electric capacity of each of the contact holes 20a to 20u is given by C0 and the electric capacity of the second interconnect lines 4a to 4g and the third interconnect line 6 as a whole is given by 8C in a manner described in the fourth and fifth preferred embodiments, the contact holes 21a to 21u, the second interconnect lines 4a to 4g and the third interconnect line 6 as a whole have an electric capacity expressed by (21C0+8C).

Figure 26:
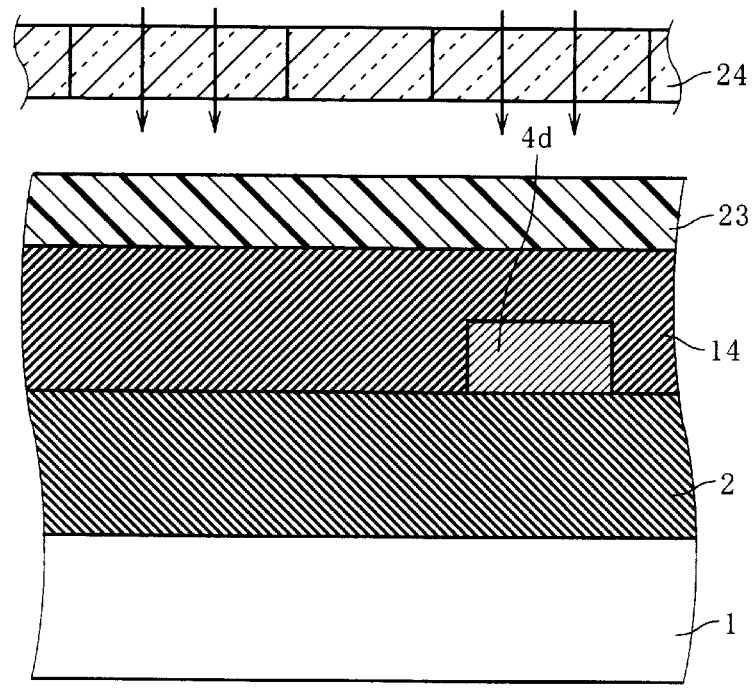
FIGS. 26 through 29 are cross-sectional views showing a method of manufacturing the semiconductor device shown in FIG. 25 in order of process steps.

FIGS. 26 through 29 are cross-sectional views showing a method of manufacturing the semiconductor device shown in FIG. 25 in order of process steps. It is assumed herein that the second interconnect lines 4a to 4g are metal interconnect lines. First, a structure similar to that shown in FIG. 18 is provided by the method described with respect to the fourth preferred embodiment. A photoresist 23 is applied to the upper surface of the insulating film 14, and is exposed to ultraviolet light, using a photomask 24 having a predetermined pattern (FIG. 26).

Figure 27:
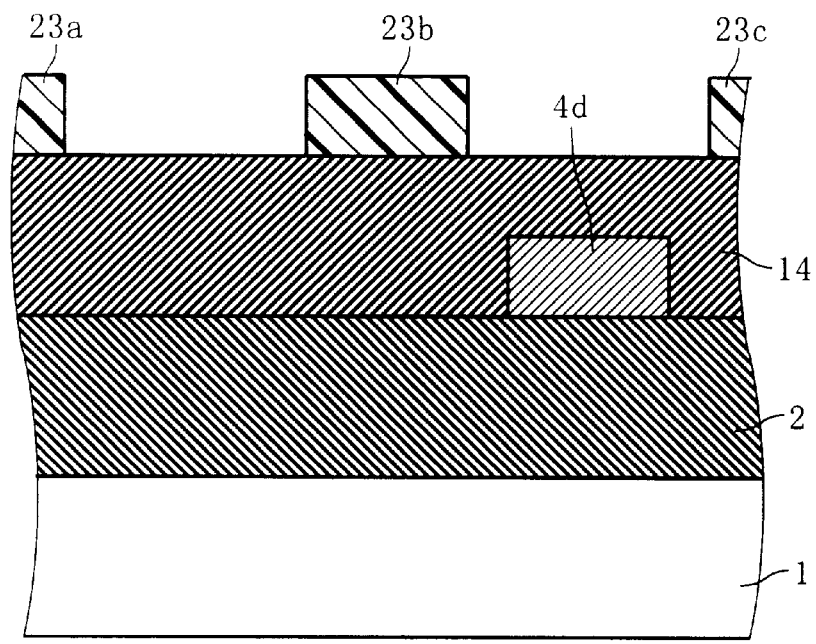
Figure 28:
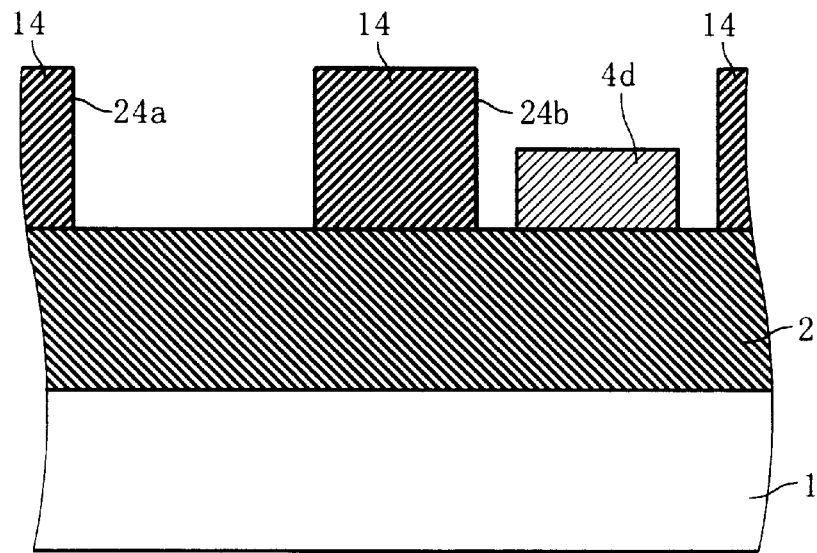

Next, part of the photoresist 23 which is exposed to the ultraviolet light is removed. As a result, photoresists 23a to 23c are left on the upper surface of the insulating film 14 (FIG. 27). As depicted in FIG. 27, the photoresist 23a to 23c are absent on part of the upper surface of the insulating film 14 which overlies the second interconnect line 4d. Then, using the photoresists 23a to 23c as a mask, anisotropic dry etching which exhibits a higher etch rate in a direction of the depth of the substrate 1 is performed on the insulating film 14 to expose the upper surface of the insulating film 2. This dry etching is performed under the condition that the second interconnect line 4d is not etched away. Consequently, contact holes 24a and 24b are formed extending through the insulating film 14 from the upper surface of the insulating film 14 to the upper surface of the insulating film 2. Thereafter, the photoresists 23a to 23c are removed (FIG. 28). As depicted in FIG. 28, the second interconnect line 4d is exposed in the contact hole 24b.

Figure 29:
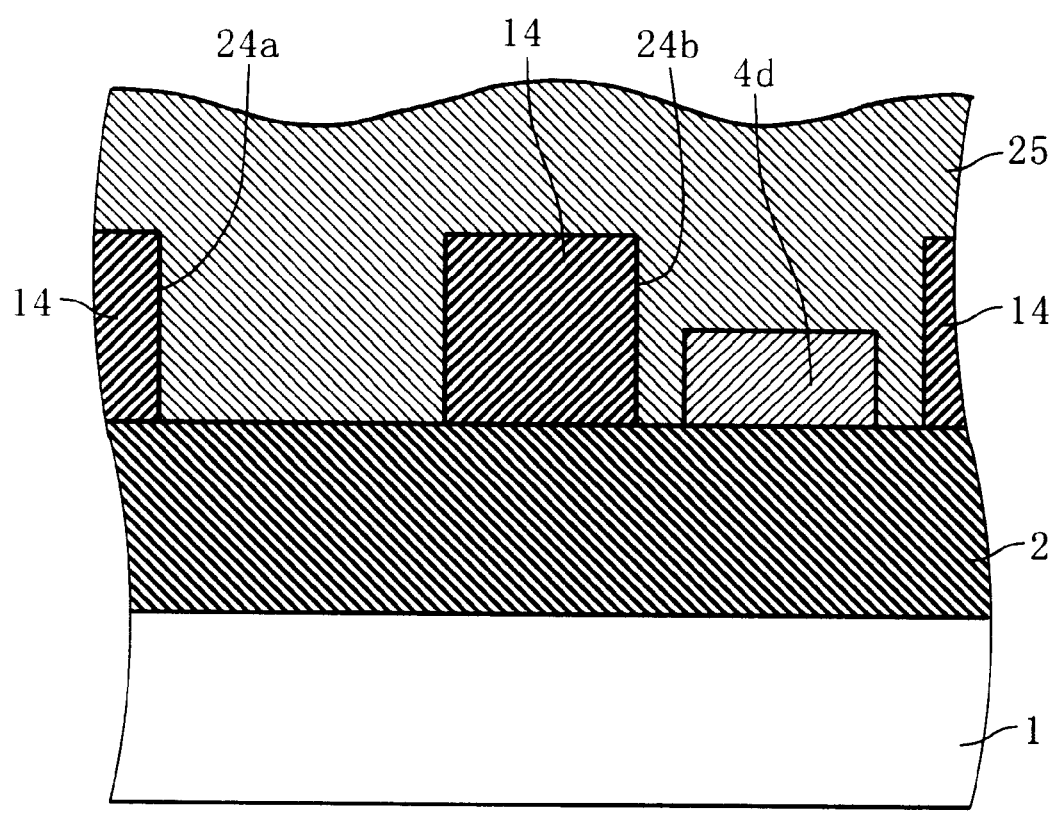

A metal film 25 is formed on the entire top surface of a resultant structure by the CVD process and the like (FIG. 29). The CMP process and the like is performed to polish the metal film 25 until the upper surface of the insulating film 14 is exposed, and to planarize the surface of the metal film 25. The contact holes 24a and 24b filled with the metal film 25 serve as the contact holes 20r and 21r, respectively. The semiconductor device shown in FIG. 25 is manufactured through these process steps.

Alignment of the photomask 24 with low precision or dry etching of the insulating film 14 for the formation of the contact holes 24a and 24b with low precision, for example, in the semiconductor device manufacturing steps causes the contact holes 20r and 21r to come into contact with each other.

Referring again to FIG. 24, whether or not there is contact between the contact holes 20a to 20u and the respectively associated contact holes 21a to 21u may be evaluated by observing the surface of the semiconductor device through an electron microscope such as a SEM. More specifically, the upper surface of the semiconductor device is irradiated with charged particles such as an electron beam. This causes electric charges to be injected into the contact holes 20a to 20u, and 21a to 21u. These electric charges are distributed uniformly in the contact holes 20a to 20u, and 21a to 21u. Each of the contact holes 20a to 20u, and 21a to 21u has a constant amount of charges Q.

Attention is given to the contact holes 20r and 21r, for example. If the contact holes 20r and 21r are out of contact with each other, the electric capacity of the contact hole 20r equals the electric capacity C0 that the contact hole 20r possesses by itself. In this case, the potential V1 at the contact hole 20r is expressed by V1=Q/C0. On the other hand, if the contact holes 20r and 21r are in contact with each other, the electric capacity of the contact hole 20r equals the sum (22C0+8C) of the electric capacity (C0) of the contact hole 20r and the electric capacity (21C0+8C) of the contact holes 21a to 21u, the second interconnect lines 4a to 4g and the third interconnect line 6 as a whole. That is, the second interconnect lines 4a to 4g and the third interconnect line 6 which are electrically connected to the contact hole 21r, similar to the fifth interconnect line 10 shown in FIG. 8, function to sufficiently increase the electric capacity of the contact hole 21r relative to the electric capacity of the contact hole 20r. The sum of the amounts of charges injected into the contact holes 20r, and 21a to 21u is expressed by 22Q. In this instance, the potential V2 at the contact hole 20r is expressed by V2=22Q/(22C0+8C) which is lower than the potential V1.

Thus, the potential at the contact holes 20a to 20u irradiated with the charged particles differs depending on whether or not there is contact between the contact holes 20a to 20u and the respectively associated contact holes 21a to 21u. The amount of secondary electrons emitted from the contact holes 20a to 20u differs depending on the level of the potential at the contact holes 20a to 20u.

When the surface of the semiconductor device shown in FIG. 24 is observed through the electron microscope, each of the contact holes 20a to 20u appears as a dark image if it is out of contact with an associated one of the contact holes 21a to 21u, and appears as a bright image if it is in contact therewith. Therefore, the difference between the contact holes 20a to 20u in the amount of secondary electrons emitted therefrom may be detected as a potential contrast and used to evaluate whether or not there is contact between the contact holes 20a to 20u and the respectively associated contact holes 21a to 21u.

A potential difference by a factor of two or greater between a contacting contact hole and a non-contacting contact hole is desirable for the detection of the difference in the amount of secondary electrons emitted based on whether or not there is contact between adjacent contact holes as the potential contrast. In the above-mentioned instance, it is desirable that the sum (22C0+8C) of the electric capacities of the contact hole 20r, and 21a to 21u, the second interconnect lines 4a to 4g and the third interconnect line 6 is at least twice the sum (22C0) of the electric capacities of the contact hole 20r and the contact holes 21a to 21u irradiated with the charged particles.

As described hereinabove, the semiconductor device according to the sixth preferred embodiment is designed such that the first and second conductor patterns are electrically isolated from the substrate. This eliminates the step of forming a contact hole for fixing the second conductor patterns at the substrate potential which has been performed in the method of manufacturing the background art semiconductor device.

Seventh Preferred Embodiment

Figure 30:
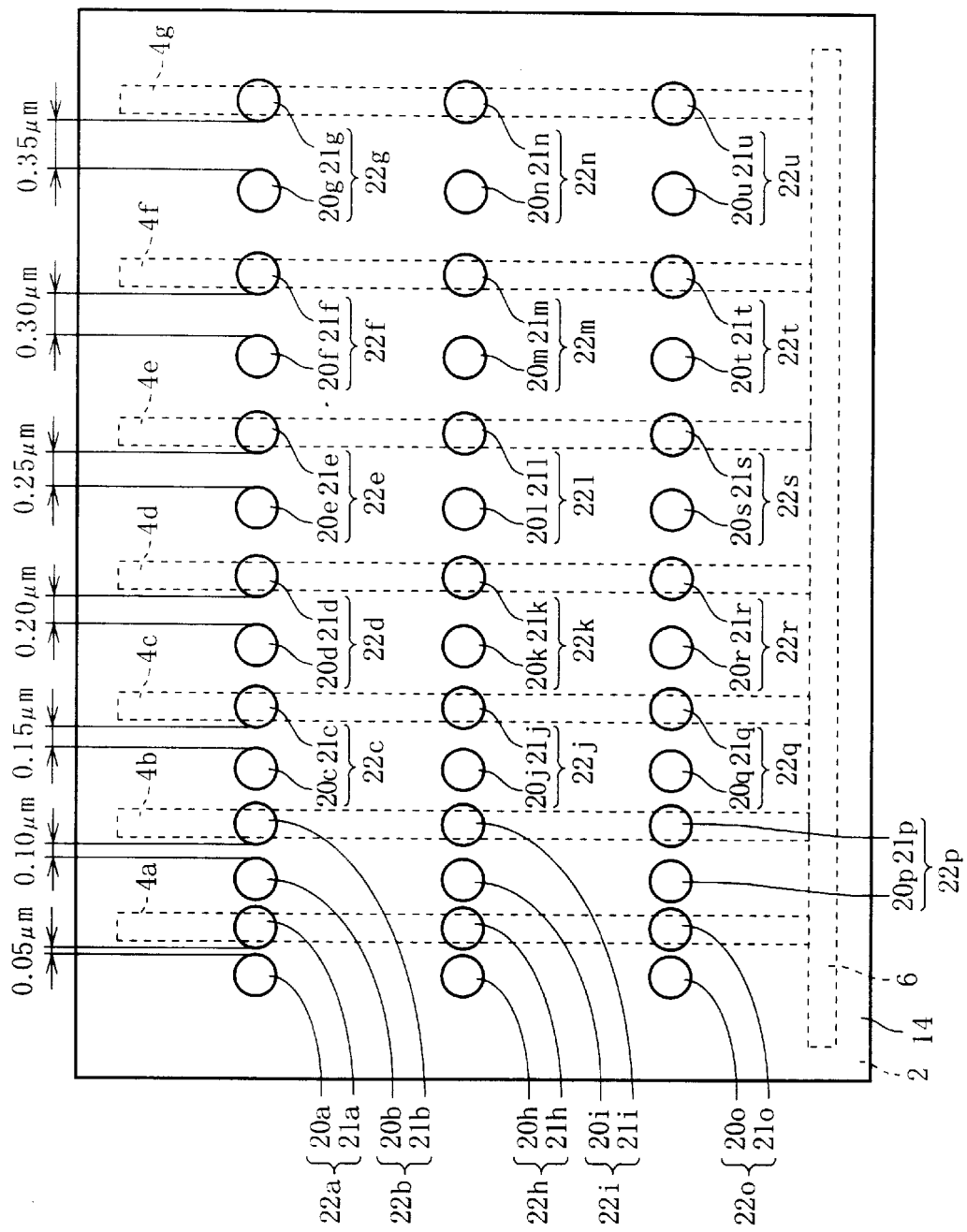
FIG. 30 is a top plan view of the semiconductor device according to a seventh preferred embodiment of the present invention.

FIG. 30 is a top plan view of the semiconductor device according to a seventh preferred embodiment of the present invention. According to the seventh preferred embodiment, the contact holes 20a to 20u (also referred to as "first conductor patterns" in the seventh preferred embodiment) and the respectively associated contact holes 21a to 21u (also referred to as "second conductor patterns" in the seventh preferred embodiment) which are provided in the semiconductor device of the sixth preferred embodiment shown in FIG. 24 are arranged alternately so that the spacings therebetween are changed stepwise in increments of 0.05 μm in a range from 0.05 μm to 0.35 μm. For example, the spacings between the contact holes 20*a*, 20*h*, 20*o* and the respectively associated contact holes 21*a*, 21*h*, 21*o* are 0.05 μm, and the spacings between the contact holes 20*b*, 20*i*, 20*p* and the respectively associated contact holes 21*b*, 21*i*, 21*p* are 0.10 μm. The remaining structure of the semiconductor device of the seventh preferred embodiment is similar to that of the semiconductor device of the sixth preferred embodiment shown in FIGS. 24 and 25.

As described hereinabove, the semiconductor device according to the seventh preferred embodiment includes the plurality of test patterns having the stepwise changed spacings between the first conductor patterns and the respectively associated second conductor patterns. Then, if the observation of the semiconductor device of the seventh preferred embodiment through the electron microscope shows, for example, that there is contact between the adjacent contact holes in the test patterns 22*a* to 22*c*, 22*h* to 22*j*, and 22*o* to 22*q* but there is no contact between the adjacent contact holes in the test patterns 22*d* to 22*g*, 22*k* to 22*n*, and 22*r* to 22*u*, it is found that a minimum spacing of 0.20 μm allows the first and second conductor patterns to be arranged in non-contacting relationship in the photolithographic technique employed for the formation of the semiconductor device. The semiconductor device of the seventh preferred embodiment can be used by itself to determine the minimum spacing between the adjacent contact holes in non-contacting relationship.

Eighth Preferred Embodiment

The above described preferred embodiments can suitably evaluate whether or not there is contact between adjacent first and second conductor patterns. However, the semiconductor device such as that of the fourth to seventh preferred embodiments wherein the plurality of test patterns are formed and the first conductor patterns are contact holes is required to detect the amount of secondary electrons emitted from the contact holes for each test pattern in order to evaluate whether or not there is contact between the contact holes and the second conductor patterns for all test patterns. An eighth preferred embodiment of the present invention proposes the semiconductor device capable of evaluating whether or not there is contact between a contact hole and another conductor pattern for at least one of a group of test patterns.

Figure 31:
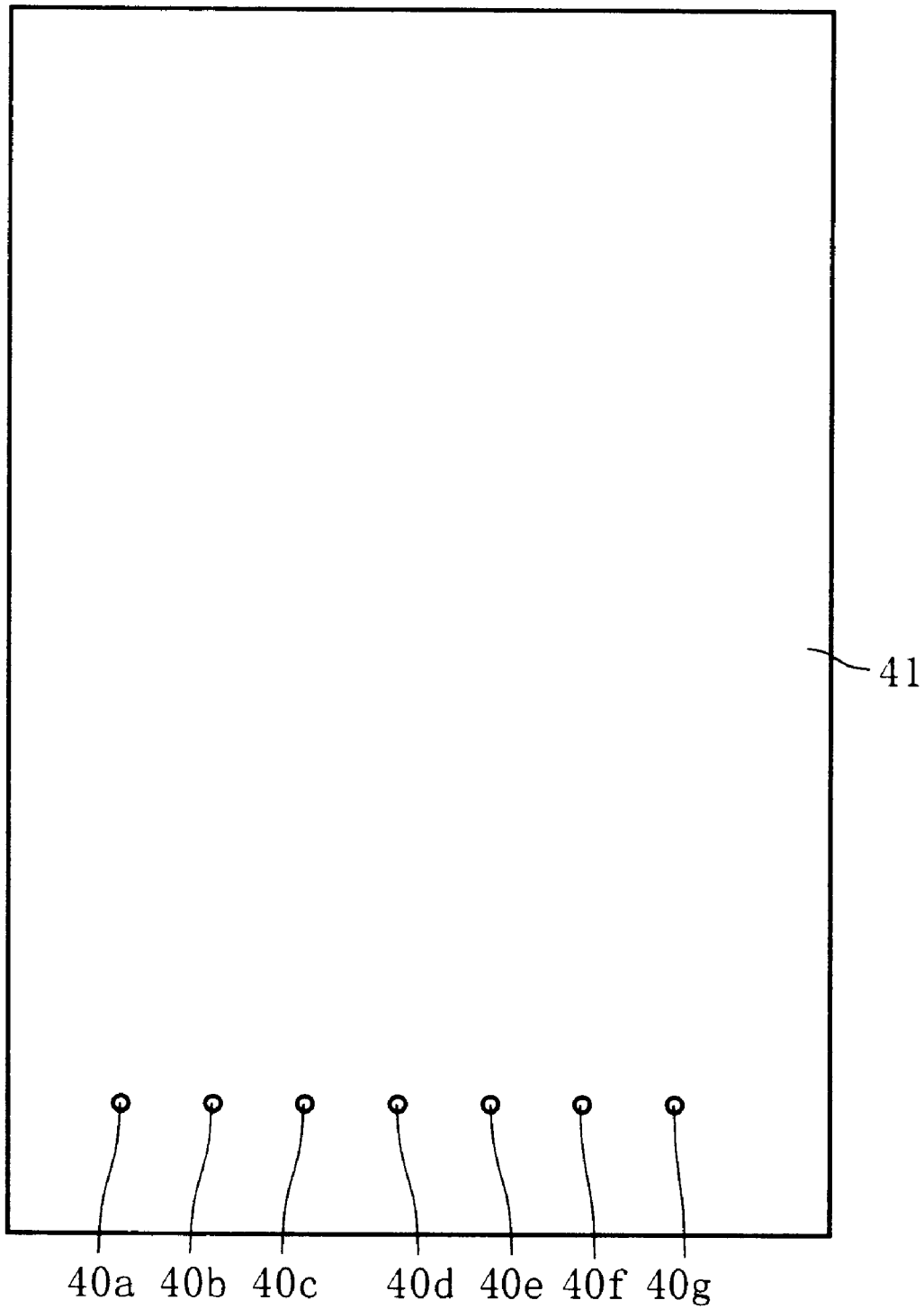
FIG. 31 is a top plan view of the semiconductor device according to an eighth preferred embodiment of the present invention.
Figure 32:
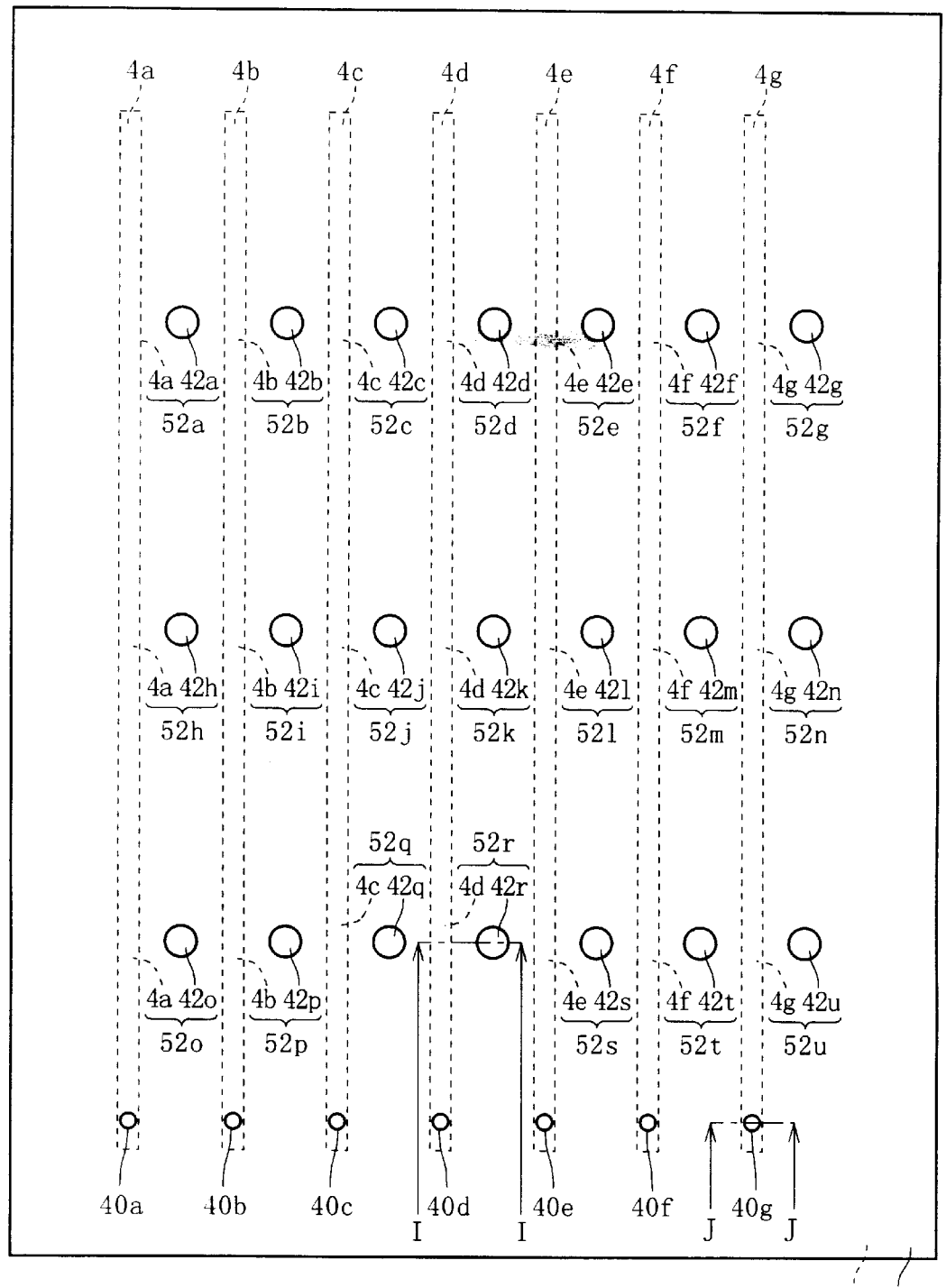
FIG. 32 is a top plan view of the semiconductor device of FIG. 31, with parts not shown.
Figure 33:
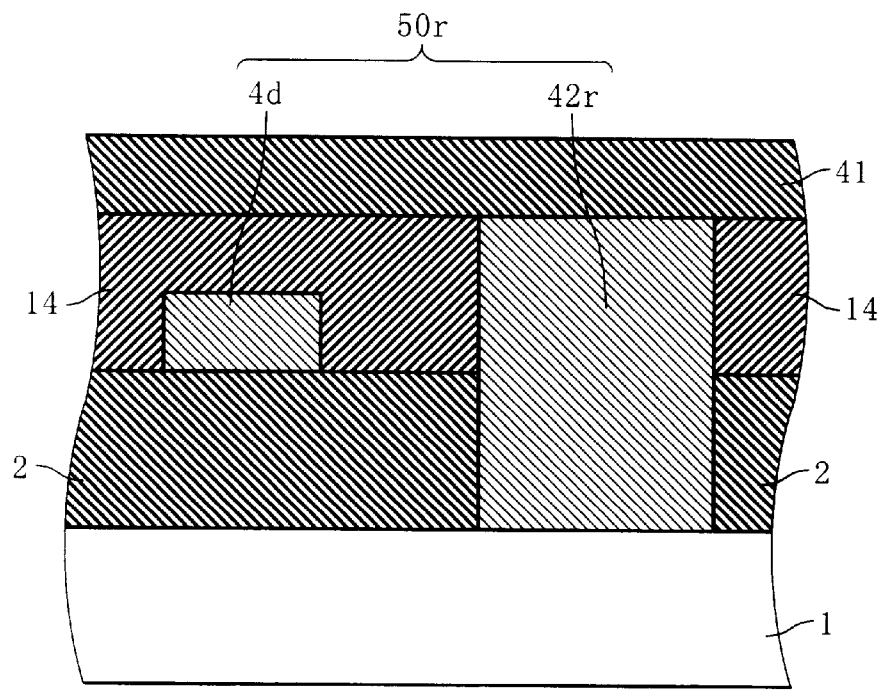
FIG. 33 is a cross-sectional view of the semiconductor device taken along the line I—I of FIG. 32.
Figure 34:
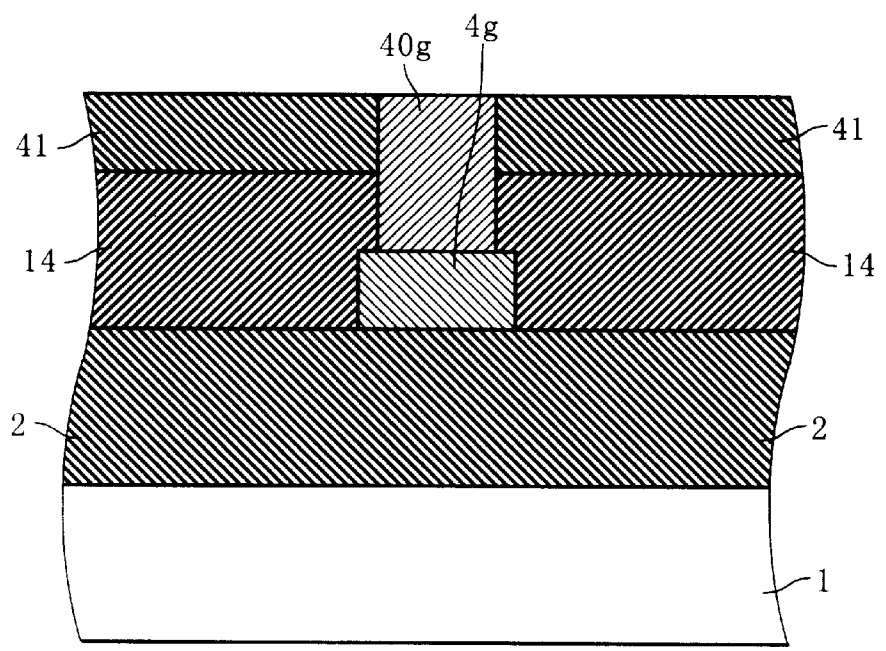
FIG. 34 is a cross-sectional view of the semiconductor device taken along the line J—J of FIG. 32.

FIG. 31 is a top plan view of the semiconductor device according to the eighth preferred embodiment of the present invention. Seven contact holes 40*a* to 40*g* each filled with a conductor and having a diameter of 0.3 μm are formed in an insulating film 41. FIG. 32 is a top plan view of the semiconductor device shown in FIG. 31, with the insulating film 41 not shown. FIG. 33 is a cross-sectional view of the semiconductor device taken long the line I—I of FIG. 32. FIG. 34 is a cross-sectional view of the semiconductor device taken along the line J—J of FIG. 32.

With reference to FIG. 33, the insulating film 2 is formed on the entire upper surface of the substrate 1, and the second interconnect line 4*d* is formed on the upper surface of the insulating film 2. The insulating film 14 is formed on the entire upper surface of the insulating film 2. A contact hole 42*r* filled with a conductor is formed adjacent to the second interconnect line 4*d* and extends through the insulating films 14 and 2 between the upper surface of the insulating film 14 and the upper surface of the substrate 1. The insulating film 41 not shown in FIG. 32 is formed on the entire upper surface of the insulating film 14. Although there is shown in FIG. 33 only a representative section of the semiconductor device of FIG. 32 in which a test pattern 50*r* comprised of the second interconnect line 4*d* and the contact hole 42*r* is formed, sections of the semiconductor device in which other test patterns 50*a* to 50*q*, and 50*s* to 50*u* are formed are similar in construction to the section shown in FIG. 33. Specifically, the second interconnect lines 4*a* to 4*g* are electrically isolated from the substrate 1, and contact holes 42*a* to 42*u* are electrically connected to the substrate 1.

With reference to FIG. 34, the insulating film 2 is formed on the entire upper surface of the substrate 1, and the second interconnect line 4*g* is formed on the upper surface of the insulating film 2. The insulating film 14 is formed on the entire upper surface of the insulating film 2. The insulating film 41 not shown in FIG. 32 is formed on the entire upper surface of the insulating film 14. The contact hole 40*g* filled with a conductor is formed extending through the insulating films 14 and 41 between the upper surface of the insulating film 41 and the upper surface of the second interconnect line 4*g*. Although there is shown in FIG. 34 only a representative section of the semiconductor device of FIG. 32 in which the contact hole 40*g* is formed, sections of the semiconductor device in which other contact holes 40*a* to 40*f* are formed are similar in construction to the section shown in FIG. 34.

Referring to FIG. 32, the seven second interconnect lines 4*a* to 4*g* are formed on the upper surface of the insulating film 2. Each of the second interconnect lines 4*a* to 4*g* is an interconnect line of metal or doped polysilicon which is 0.2 μm in width and 10 μm in length. A total of 21 contact holes 42*a* to 42*u* are arranged such that three of the contact holes 42*a* to 42*u* alternate with each of the second interconnect lines 4*a* to 4*g* adjacent thereto. For example, the contact holes 42*a*, 42*h* and 42*o* are disposed adjacent to the second interconnect line 4*a*, and the contact holes 42*b*, 42*i* and 42*p* are disposed adjacent to the second interconnect line 4*b*. As a result, a total of 21 test patterns 50*a* to 50*u* are formed in the arrangement shown in FIG. 32. The contact holes 42*a* to 42*u* have a diameter of 0.3 μm. The second interconnect lines 4*a* to 4*g* are spaced 0.2 μm apart from the respectively associated contact holes 42*a* to 42*u*.

A method of evaluating the semiconductor device according to the eighth preferred embodiment will now be described with attention given to the test patterns 50*d*, 50*k* and 50*r* comprised of the second interconnect line 4*d* and the contact holes 42*d*, 42*k* and 42*r*, with reference to FIG. 32.

Whether or not there is contact between the second interconnect line 4*d* and the associated contact holes 42*d*, 42*k* and 42*r* may be evaluated by observing the surface of the semiconductor device through an electron microscope such as a SEM. More specifically, charged particles such as an electron beam are directed toward a section of the semiconductor device in which at least the contact hole 40*d* is formed, to inject electric charges into the second interconnect line 4*d* through the contact hole 40*d*. If the second interconnect line 4*d* is out of contact with the contact holes 42*d*, 42*k* and 42*r*, the electric charges injected in the second interconnect line 4*d* are stored in the contact hole 40*d* and the second interconnect line 4*d*. Then, the contact hole 40*d* is at a fixed potential depending on the electric capacity of the contact hole 40*d* and the second interconnect line 4*d*.

On the other hand, if the second interconnect line 4*d* is in contact with at least one of the contact holes 42*d*, 42*k* and 42*r*, the electric charges injected in the second interconnect line 4d flow through the at least one of the contact holes 42d, 42k and 42r which is in contact with the second interconnect line 4d into the substrate 1. That is, the electric charges are not stored in the contact hole 40d, and the contact hole 40d is at the same potential as the substrate 1 (e.g., at a ground potential).

Thus, the potential at the contact hole 40d irradiated with the charged particles differs depending on whether or not there is contact between the second interconnect line 4d and at least one of the contact holes 42d, 42k, 42r. The amount of secondary electrons emitted from the contact hole 40d differs depending on the level of the potential at the contact hole 40d.

Therefore, the difference between the contact holes 40a to 40g in the amount of secondary electrons emitted therefrom may be detected as a potential contrast and used to evaluate whether or not there is contact between the second interconnect lines 4a to 4f and the respectively associated contact holes 42a to 42u adjacent thereto.

As described hereinabove, according to the semiconductor device including a plurality of test patterns each comprised of an interconnect line and contact hole pair and the method of evaluating the semiconductor device in the eighth preferred embodiment, the evaluation of whether or not there is contact between each interconnect line and its associated contact holes is made such that whether each interconnect line is out of contact with all of its associated contact holes adjacent thereto or in contact with any one of its associated contact holes is evaluated for each group of test patterns.

Additionally, only a region of the upper surface of the semiconductor device in which the contact holes 40a to 40g are formed is required to be irradiated with the charged particles such as the electron beam for the observation of the semiconductor device through the electron microscope. Thus, the region irradiated with the charged particles is smaller.

Figure 35:
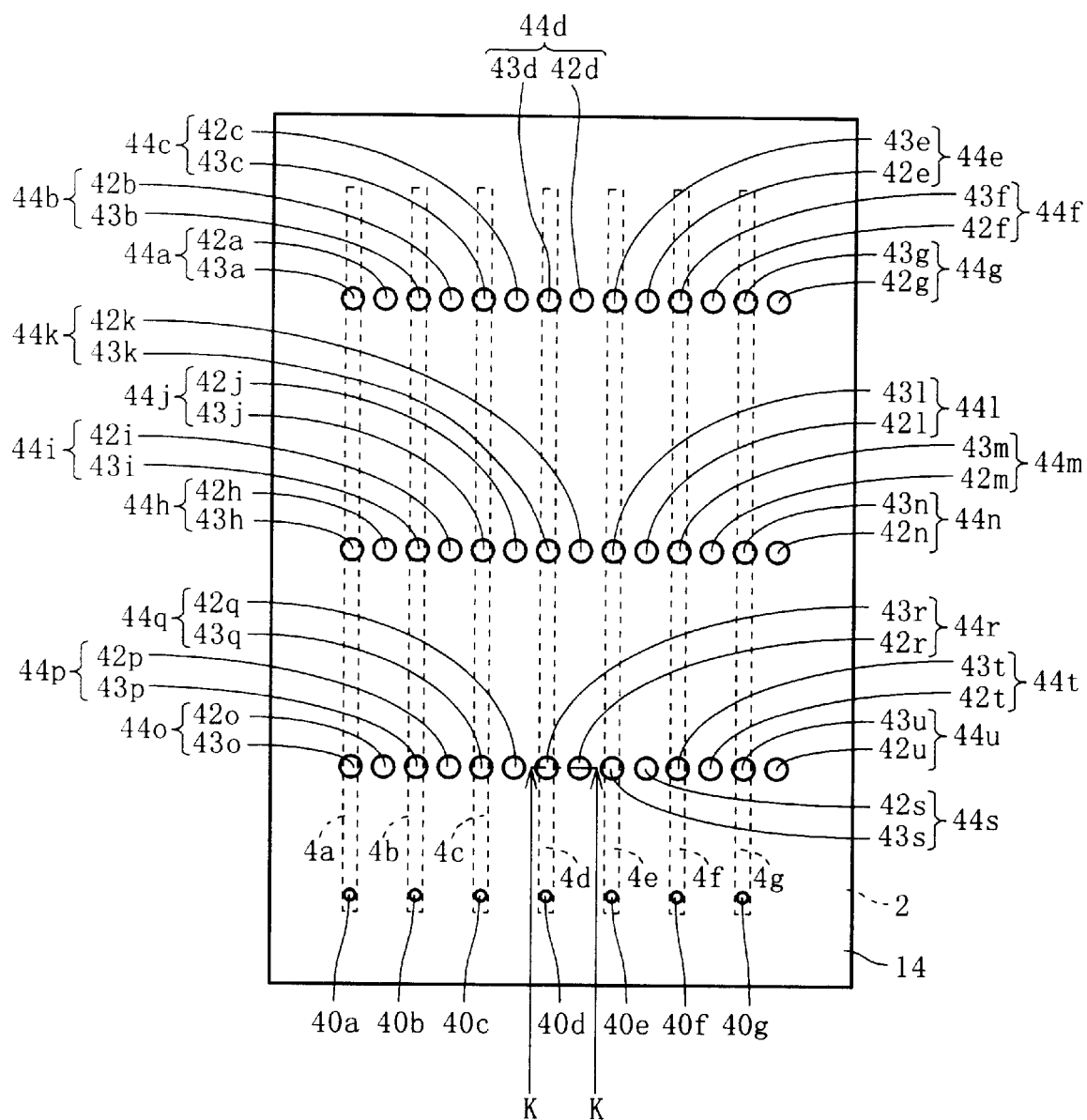
FIG. 35 is a top plan view of the semiconductor device in another form according to the eighth preferred embodiment of the present invention.
Figure 36:
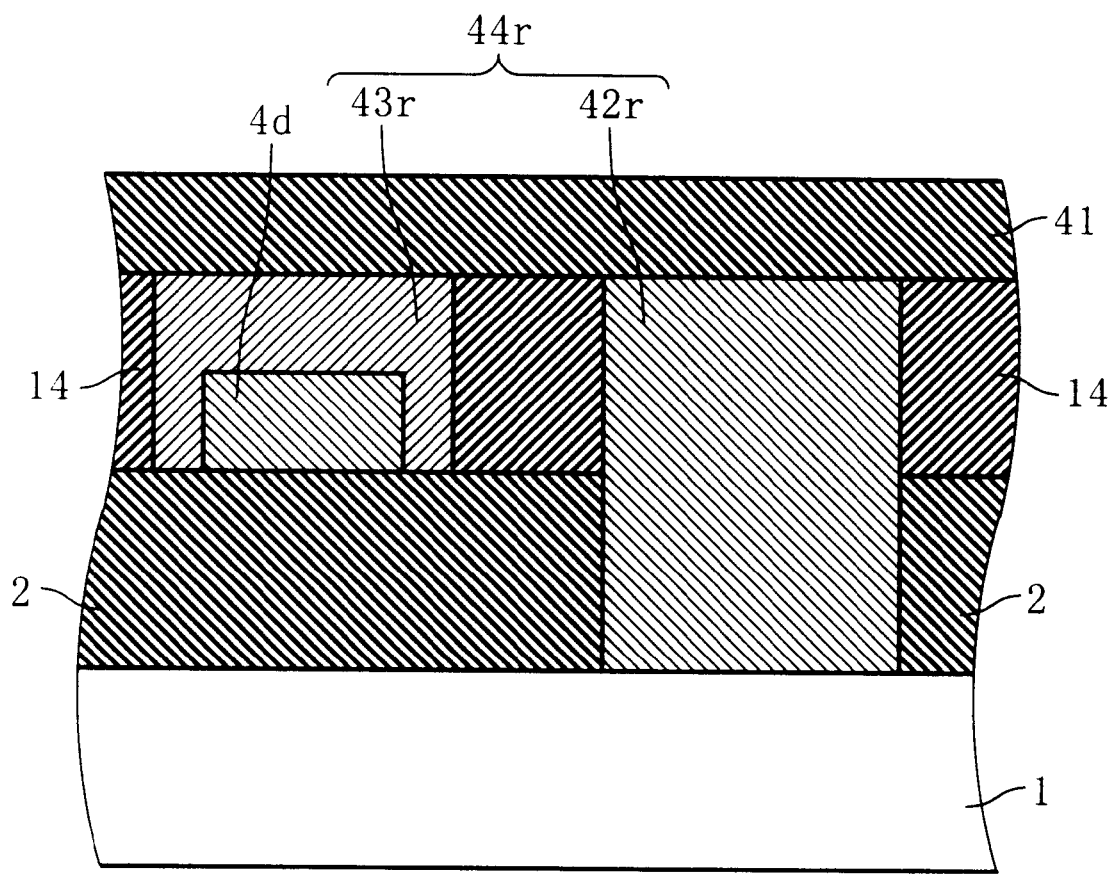
FIG. 36 is a cross-sectional view of the semiconductor device taken along the line K—K of FIG. 35.
Figure 37:
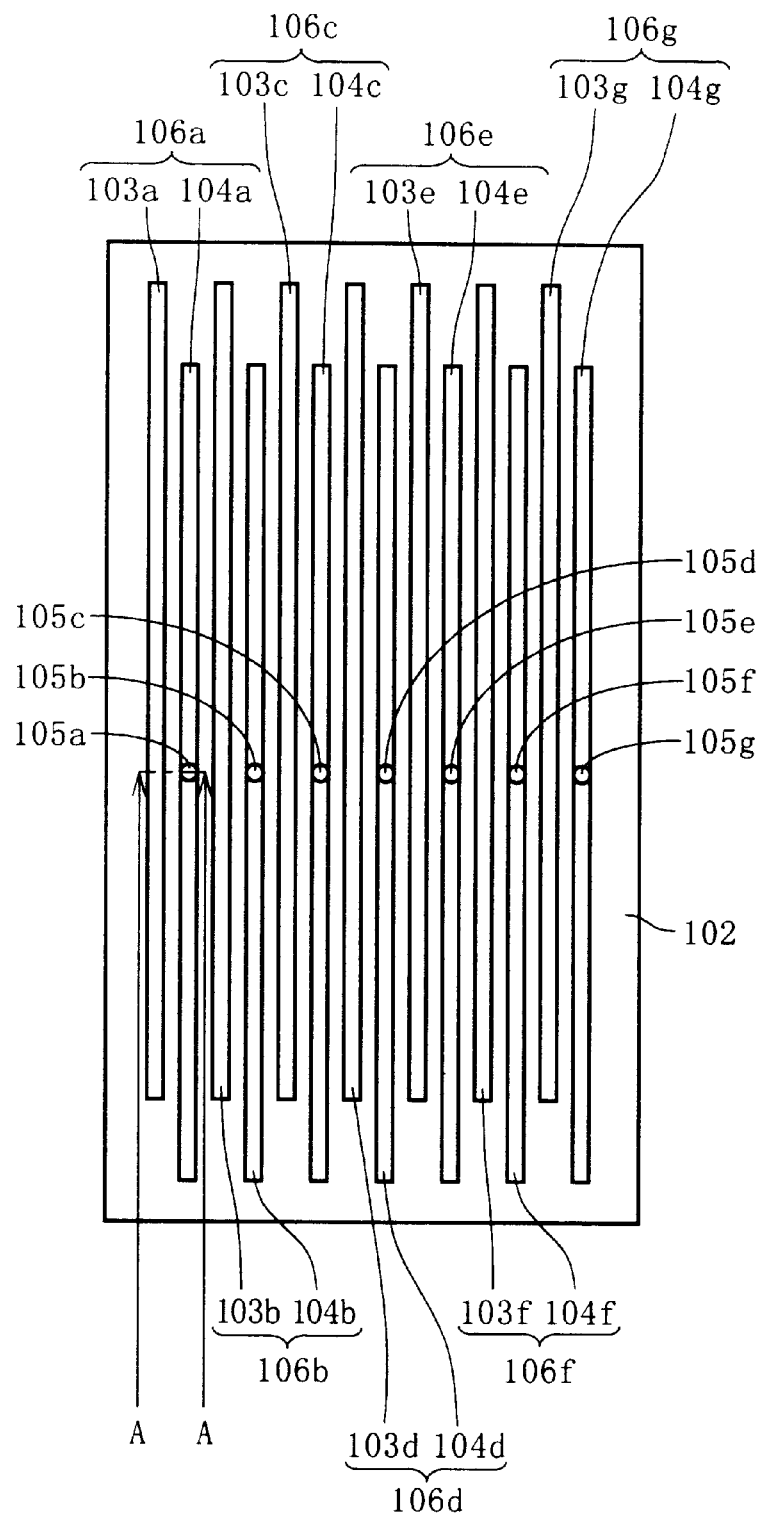
FIG. 37 is a top plan view of a background art semiconductor device.
Figure 38:
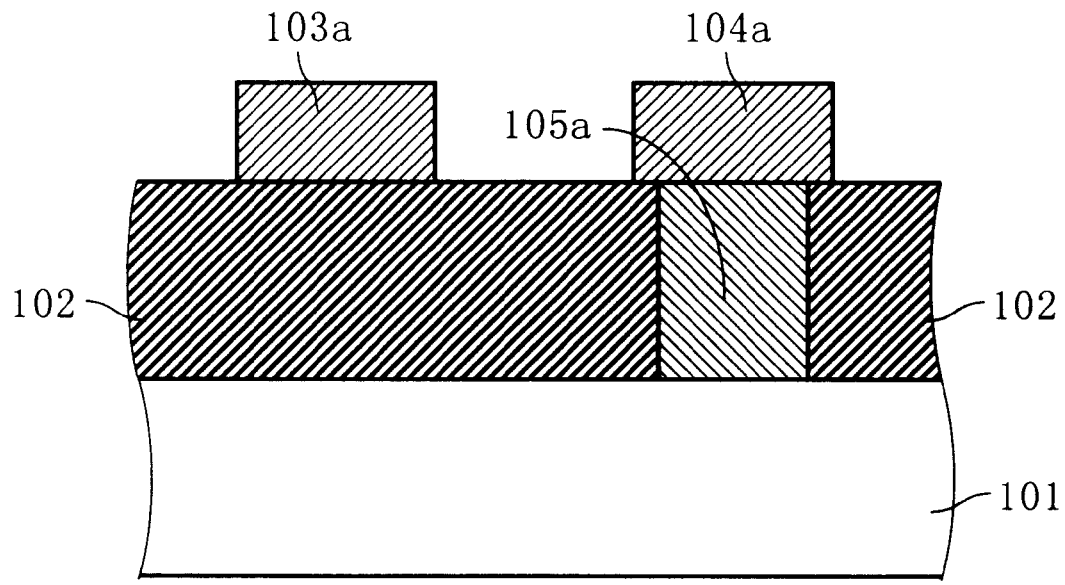
FIG. 38 is a cross-sectional view of the semiconductor device taken along the line A—A of FIG. 37.

FIG. 35 is a top plan view of the semiconductor device in another form according to the eighth preferred embodiment of the present invention. FIG. 36 is a cross-sectional view of the semiconductor device taken along the line K—K of FIG. 35. The semiconductor device shown in FIG. 36 comprises a contact hole 43r filled with a conductor and extending through the insulating film 14 between the upper surface of the insulating film 14 and the upper surface of the insulating film 2 where the second interconnect line 4d is formed in addition to the constituents of the semiconductor device shown in FIG. 33. Although there is shown in FIG. 36 only a representative section of the semiconductor device of FIG. 35 in which the test pattern 50r comprised of the second interconnect line 4d and the contact hole 42r is formed, sections of the semiconductor device in which other test patterns 50a to 50q, and 50s to 50u are formed are similar in construction to the section shown in FIG. 36. The remaining structure of the semiconductor device shown in FIGS. 35 and 36 is similar to that of the semiconductor device shown in FIGS. 32 and 33. According to the semiconductor device shown in FIGS. 35 and 36 which includes a plurality of test patterns each comprised of a contact hole pair, the evaluation of whether or not there is contact between adjacent contact holes is made such that whether all pairs of adjacent contact holes are out of contact with each other or any one of the pairs of adjacent contact holes are in contact with each other is evaluated for each group of test patterns.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a substrate;

a first conductor pattern electrically isolated from said substrate and having a first electric capacity and a first exposed part to be irradiated with charged particles;

a second conductor pattern electrically isolated from said substrate and formed adjacent to said first conductor pattern, said second conductor pattern having a second electric capacity and a second exposed part to be irradiated with said charged particles; and a conductor region electrically isolated from said substrate and electrically connected to said second conductor pattern and not contacting said first conductor pattern, said conductor region having a third electric capacity, said charged particles being uniformly distributed in said first and second exposed parts, wherein the sum of said second electric capacity and said third electric capacity is greater than said first electric capacity.

2. The semiconductor device according to claim 1, wherein each of said first conductor pattern and said second conductor pattern is an interconnect line.

3. The semiconductor device according to claim 1, wherein said first conductor pattern fills a contact hole, and said second conductor pattern is an interconnect line.

4. The semiconductor device according to claim 1, wherein each of said first conductor pattern and said second conductor pattern ills a contact hole.

5. The semiconductor device according to claim 1, further comprising a plurality of test patterns each having said first conductor pattern and said second conductor pattern taken as a pair, said plurality of test patterns including two test patterns differing from each other in spacing between said pair of first and second conductor patterns.

6. The semiconductor device according to claim 1, wherein the sum of said second electric capacity and said third electric capacity is at least twice said first electric capacity.

7. A semiconductor device comprising:

a substrate;

an interconnect line electrically isolated from said substrate;

a first contact hole filled with a first conductor and having an exposed part to be irradiated with a charged particle, said first conductor being electrically connected to said interconnect line and electrically isolated from said substrate; and a plurality of second contact holes each filled with a second conductor electrically connected to said substrate, said plurality of second contact holes being arranged adjacent to said interconnect line.

8. The semiconductor device according to claim 7, further comprising a plurality of third contact holes each filled with a third conductor electrically connected to said interconnect line and electrically isolated from said substrate, said plurality of third contact holes being arranged adjacent to said plurality of second contact holes respectively.

* * * * *